US010551875B2

(12) United States Patent
Song et al.

(10) Patent No.: US 10,551,875 B2
(45) Date of Patent: Feb. 4, 2020

(54) INTERFERENCE FIT FOR PRINTED CIRCUIT BOARD AND LIGHT GUIDE MEMBER OF TOUCH SCREEN MODULE

(71) Applicant: HEWLETT-PACKARD DEVELOPMENT COMPANY, L.P., Spring, TX (US)

(72) Inventors: Sung Weon Song, Gyeonggi-do (KR); Hwikyeong An, Seoul (KR); Hansang Oh, Seoul (KR)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 16/070,707

(22) PCT Filed: Nov. 25, 2016

(86) PCT No.: PCT/KR2016/013690
§ 371 (c)(1),
(2) Date: Jul. 17, 2018

(87) PCT Pub. No.: WO2017/126800
PCT Pub. Date: Jul. 27, 2017

(65) Prior Publication Data
US 2019/0033916 A1     Jan. 31, 2019

(30) Foreign Application Priority Data
Jan. 19, 2016   (KR) .................. 10-2016-0006468

(51) Int. Cl.
*G06F 1/16* (2006.01)
*G06F 3/042* (2006.01)
(Continued)

(52) U.S. Cl.
CPC ......... *G06F 1/1643* (2013.01); *G02B 6/0025* (2013.01); *G02B 6/102* (2013.01);
(Continued)

(58) Field of Classification Search
CPC ......... G06F 3/042–0428; G06F 3/0412; G06F 1/1643
See application file for complete search history.

(56) References Cited

U.S. PATENT DOCUMENTS

2002/0148038 A1\* 10/2002 Gardenier .............. A47K 3/001
4/575.1
2007/0165008 A1\* 7/2007 Crockett ............... G06F 3/0421
345/175
(Continued)

FOREIGN PATENT DOCUMENTS

| EP | 2434196 A1 | 3/2012 |
|---|---|---|
| KR | 10-2007-0052423 A | 5/2007 |
| KR | 10-2012-0021695 A | 3/2012 |

*Primary Examiner* — Hang Lin
(74) *Attorney, Agent, or Firm* — Staas & Halsey LLP

(57) ABSTRACT

A display apparatus includes a printed circuit board on which are mounted a light emitter to emit infrared rays and a light receiver to receive the infrared rays, and a light guide member surrounding the perimeter of a display module, to guide the infrared rays emitted from the light emitter to be received by the light receiver via a touch space. An interference fit between the printed circuit board and the light guide member is provided through elastic deformation of at least one of the printed circuit board or the light guide member.

14 Claims, 27 Drawing Sheets

(51) Int. Cl.
    *H01L 27/32*     (2006.01)
    *G02F 1/1333*     (2006.01)
    *F21V 8/00*     (2006.01)
    *G02B 6/10*     (2006.01)
    *G06F 3/041*     (2006.01)
    *H05K 1/02*     (2006.01)

(52) U.S. Cl.
    CPC ............ *G02F 1/1333* (2013.01); *G06F 3/042* (2013.01); *G06F 3/0412* (2013.01); *H01L 27/32* (2013.01); *H05K 1/0274* (2013.01)

(56) References Cited

U.S. PATENT DOCUMENTS

| | | | |
|---|---|---|---|
| 2013/0242480 A1 | 9/2013 | Kim et al. | |
| 2014/0022488 A1* | 1/2014 | Yu | G02F 1/133308 349/60 |
| 2014/0267166 A1* | 9/2014 | Griffiths | G06F 3/0421 345/175 |
| 2015/0199072 A1* | 7/2015 | Zhang | G06F 3/0421 345/175 |
| 2018/0314001 A1* | 11/2018 | Veenstra | G09F 13/04 |

\* cited by examiner

INTERFERENCE FIT FOR PRINTED CIRCUIT BOARD AND LIGHT GUIDE MEMBER OF TOUCH SCREEN MODULE

CROSS REFERENCE TO RELATED APPLICATIONS

This application is a U.S. national stage of International Application No. PCT/KR2016/013690 filed on Nov. 25, 2016, which claims the priority benefit of Korean Patent Application No. 10-2016-0006468 filed on Jan. 19, 2016. Both the International Application and the Korean Patent Application are incorporated by reference herein in their entirety.

BACKGROUND

The disclosure relates to a display apparatus and an image forming apparatus including the same.

A display apparatus is an apparatus providing a display screen. A display apparatus having a touch screen function is an electronic apparatus in which a touch input is executed when a display screen is touched. Examples of a display apparatus having a touch screen function include a smart phone, a tablet personal computer, a monitor, a television, etc.

Display apparatuses having a touch screen function may be classified according to touch input methods, e.g., a constant pressure method of identifying pressure sensed on a display screen, an electrostatic method of identifying a current sensed on a display screen, an ultrasound method of identifying ultrasound waves sensed on a display screen, an infrared method using straight line propagation of infrared rays, etc.

Here, a display apparatus having a touch screen function according to the infrared method identifies the coordinates of a touch input, based on the fact that a propagation path of infrared rays is blocked when the display screen is touched.

DETAILED DESCRIPTION

Figure 1:
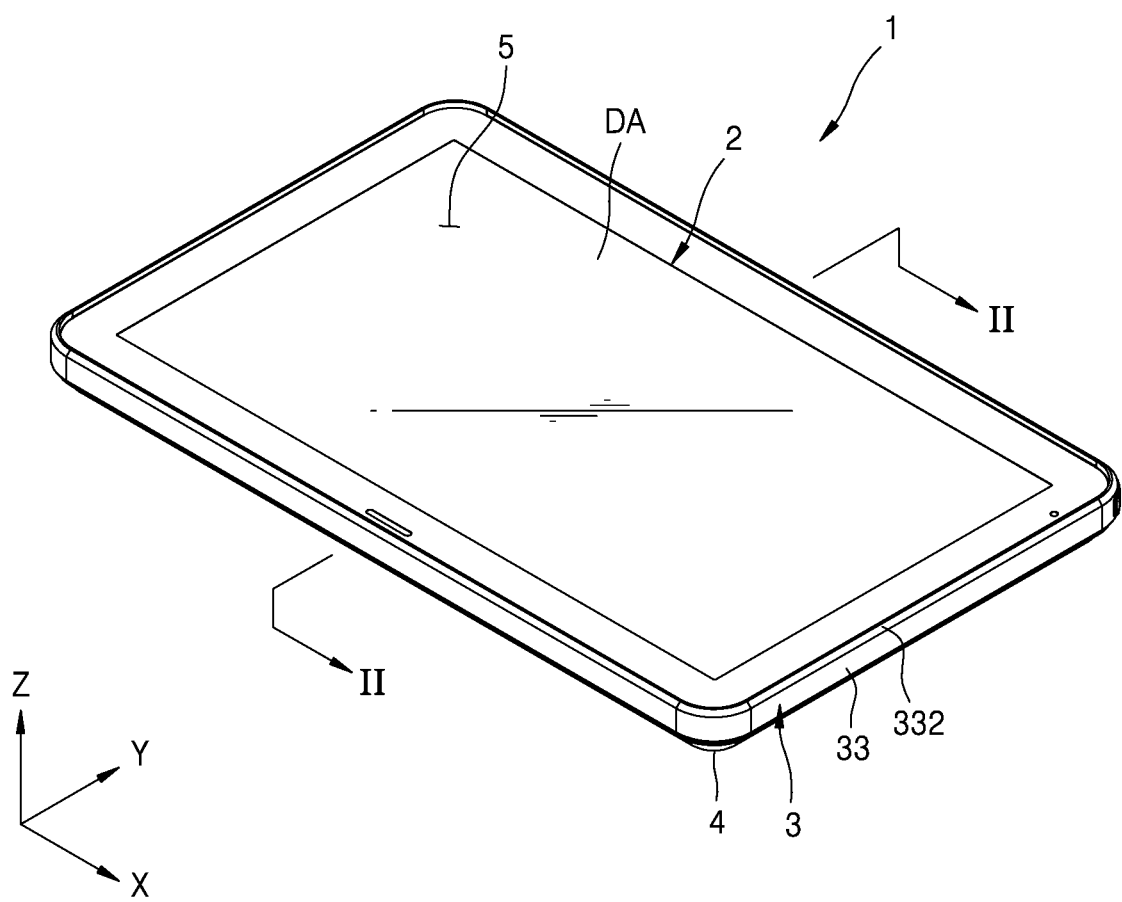
FIG. 1 is an assembled perspective view of a display apparatus according to an example.

Disclosed are a display apparatus having a touch screen function using infrared rays, in which a width of a bezel region may be minimized and an increase in power consumption for a touch input may be prevented, and an image forming apparatus including the same.

Also disclosed are a display apparatus having a touch screen function using infrared rays, in which a width of a bezel region may be minimized and a touch input may be prevented from being erroneously implemented, and an image forming apparatus including the same.

According to the disclosure, a display apparatus may include a display module, a touch screen module providing a touch space in front of the display module, and a printed circuit board behind the display module. The touch screen module may include: a plurality of light emitters mounted on the printed circuit board to emit infrared rays, a light receiver located on the printed circuit board, spaced apart from the plurality of light emitters, to receive infrared rays, and a light guide member surrounding a perimeter of the display module, to guide infrared rays emitted from the plurality of light emitters to be incident into the touch space and guide the infrared rays incident into the touch space to be received by the light receiver, and an interference fit is provided between the printed circuit board and the light guide member through elastic deformation of the printed circuit board and/or the light guide member.

In an example, the light guide member may include a plurality of coupling protrusions, and the printed circuit board may include a plurality of coupling holes to be combined with the plurality of coupling protrusions. A width of the plurality of coupling holes may be less than that of the plurality of coupling protrusions before the plurality of coupling holes are combined with the plurality of coupling protrusions.

In an example, the width of the plurality of coupling holes may be equal to that of the plurality of coupling protrusions when the plurality of coupling protrusions are combined with the plurality of coupling holes.

In an example, the plurality of coupling holes may include two first coupling holes spaced apart from each other in a first direction, and at least one second coupling hole provided between the two first coupling holes and spaced apart from the two first coupling holes in a second direction perpendicular to the first direction.

In an example, during the combining of the plurality of coupling protrusions with the plurality of coupling holes, the printed circuit board may be elastically deformed such that the width of the plurality of coupling holes may increase.

In an example, the printed circuit board may further include at least one first auxiliary coupling hole adjacent to the plurality of coupling holes.

In an example, in the combining of the plurality of coupling protrusions with the plurality of coupling holes, the light guide member may be elastically deformed such that a width of the plurality of coupling protrusions may decrease.

In an example, the light guide member may further include at least one second auxiliary coupling hole adjacent to the plurality of coupling protrusions.

In an example, the light guide member may include the plurality of coupling protrusions, a support region supporting the plurality of coupling protrusions, and a third auxiliary coupling hole adjacent to the support region. The support region may be elastically deformed during the combining of the plurality of coupling protrusions with the plurality of coupling holes.

In an example, the display apparatus may further include screws each including a screw portion and a head portion, the screw portion to be screwed into and thereby combined with one of the plurality of coupling protrusions, and the head portion being larger than the width of the plurality of coupling holes. An external diameter of the plurality of coupling protrusions may decrease in a direction toward the printed circuit board, and, during the combining of the screws with the plurality of coupling protrusions, the support region may be elastically deformed and the plurality of coupling protrusions may be combined with the plurality of coupling holes.

In an example, the width of the plurality of coupling holes may decrease in a lengthwise direction.

In an example, the light guide member may include a reflective surface exposed to the outside to reflect infrared rays, and an anti-contact protrusion protruding toward the outside may be provided adjacent to the reflective surface.

In an example, the reflective surface may have a width of 3 mm or less.

In an example, a height of the anti-contact protrusion may be in a range of 0.1 mm to 0.5 mm.

In an example, the light guide member may include a diffusion region to diffuse the infrared rays emitted from the plurality of light emitters, and a light collection region to collect the infrared rays penetrating the touch space.

According to the disclosure, a display apparatus may include: a display module, a touch screen module providing a touch space in front of the display module, and a printed circuit board behind the display module, in which the touch screen module includes a plurality of light emitters mounted on the printed circuit board to emit infrared rays, a light receiver located on the printed circuit board, spaced apart from the plurality of light emitters, to receive infrared rays, and a light guide member surrounding a perimeter of the display module to guide infrared rays emitted from the plurality of light emitters to be incident into the touch space and guide the infrared rays incident into the touch space to be received by the light receiver. The light guide member may include a reflective surface exposed to the outside to reflect infrared rays, and an anti-contact protrusion protruding toward the outside may be provided adjacent to the reflective surface.

In an example, the reflective surface may have a width of 3 mm or less.

In an example, a height of the anti-contact protrusion may be in a range of 0.1 mm to 0.5 mm.

According to the disclosure, an image forming apparatus may include the display apparatus described above.

In a display apparatus and an image forming apparatus according to examples, a width of a bezel region of the display apparatus using infrared rays may be minimized and an increase in power consumption for a touch input may be prevented.

In a display apparatus and an image forming apparatus according to other examples, a width of a bezel region of the display apparatus using infrared rays may be minimized and a touch input may be prevented from being erroneously implemented.

Hereinafter, a structure and effects of the disclosure will be described in detail with respect to examples illustrated in the accompanying drawings.

After terminology used herein will be briefly described, the disclosure will be described in detail.

In the disclosure, general terms that have been widely used nowadays are selected, if possible, in consideration of functions of the disclosure, but non-general terms may be selected according to the intentions of technicians in the art, precedents, or new technologies, etc. Also, some terms may be arbitrarily chosen by the applicant. In this case, the meanings of these terms will be explained in corresponding parts of the disclosure in detail. Thus, the terms used herein should be defined not based on the names thereof but based on the meanings thereof and the whole context of the disclosure.

In the disclosure, when an element is referred to as "including" another element, it will be understood that the element may further include other elements unless mentioned otherwise.

It will be understood that the terms "first", "second", etc., are not used to limit elements but are used to distinguish one element from another element.

Examples of the disclosure will be described in detail with reference to the accompanying drawings. However, the disclosure may be embodied in many different forms and is not limited to examples set forth herein. For clarity, parts which are not related to description of the disclosure are not illustrated in the drawings and the same reference numerals are allocated to the same components throughout the disclosure.

Figure 2:
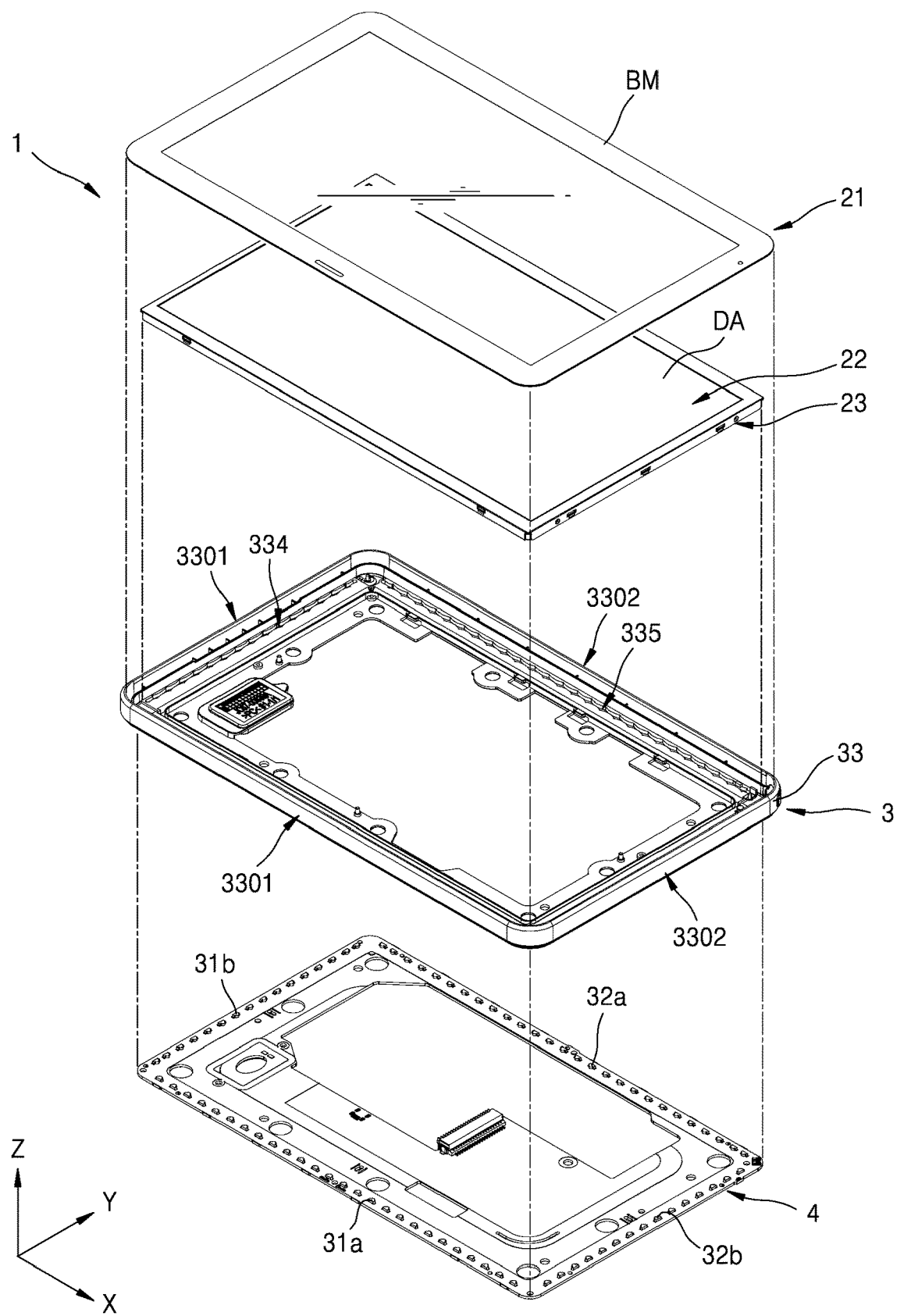
FIG. 2 is an exploded perspective view of a display apparatus according to an example.

FIG. 1 is an assembled perspective view of a display apparatus 1 according to an example. FIG. 2 is an exploded perspective view of the display apparatus 1 according to an example.

Referring to FIGS. 1 and 2, the display apparatus 1 provides a display screen DA and may identify a touch input occurring on the display screen DA. The display apparatus 1 may be a smart phone, a tablet personal computer, a monitor, a television, or the like but is not limited thereto and any device may be available as the display apparatus 1, provided that a touch input occurring on a display screen can be identified.

The display apparatus 1 includes a display module 2 providing the display screen DA, a touch screen module 3 providing a touch space 5 in a front side of the display module 2, and a printed circuit board 4 located in a rear side of the display module 2. Here, it will be defined that the front side of the display module 2 is a side in which the display screen DA of the display module 2 is provided, and the rear side of the display module 2 is a side opposite the front side of the display module 2.

The display module 2 includes a display panel 22 providing the display screen DA, and a transparent protective layer 21 in front of the display panel 22. The display module 2 may further include a support frame 23 supporting the display panel 22.

The protective layer 21 may include tempered glass. A black matrix (BM) may be arranged at an edge of the transparent protective layer 21.

The display panel 22 may be a panel having a liquid crystal display (LCD). However, a type of the display panel 22 is not limited thereto and the display panel 22 may be a panel having a light-emitting diode (LED), a panel having an organic LED (OLED), or a plasma display panel (PDP).

The touch screen module 3 may identify a touch input in the touch space 5 by using infrared rays. The infrared rays may have a wavelength of 700 nm to 1 mm.

When a user's finger is located in the touch space 5, some of infrared rays emitted into the touch space 5 may be blocked or interfered and thus the amount of infrared rays received may vary. The occurrence of a touch input at a certain location may be identified, based on a change in the amount of infrared rays.

The touch screen module 3 may include a plurality of light emitters 31a and 31b for emitting infrared rays, and a plurality of light receivers 32a and 32b for receiving the infrared rays. The plurality of light emitters 31a and 31b may be LEDs but are not limited thereto. The plurality of light receivers 32a and 32b may be photodiode (PD) sensors but are not limited thereto.

The plurality of light emitters 31a and 31b and the plurality of light receivers 32a and 32b are arranged on the printed circuit board 4 behind the display module 2.

The touch screen module 3 provides the touch space 5 in front of the display module 2.

The touch screen module 3 may be to emit infrared rays to the front of the display module 2 in a direction parallel to a surface of the display module 2, and receive the emitted infrared rays.

The touch screen module 3 includes a light guide member 33 surrounding the perimeter of the display module 2.

The light guide member 33 guides infrared rays emitted from the plurality of light emitters 31a and 31b behind the display module 2 to the touch space 5 in the front of the display module 2, and guides the emitted infrared rays from the touch space 5 to the plurality of light receivers 32a and 32b behind the display module 2.

As described above, in the display apparatus 1 according to an example, infrared rays may be guided from the rear of the display module 2 to the front of the display module 2 and from the front of the display module 2 from the rear of the display module 2 by using the light guide member 33. Accordingly, the plurality of light emitters 31a and 31b and the plurality of light receivers 32a and 32b may be arranged behind the display module 2.

If the plurality of light emitters 31a and 31b and the plurality of light receivers 32a and 32b are arranged in front of the display module 2, a space in which the plurality of light emitters 31a and 31b and the plurality of light receivers 32a and 32b may be arranged not to overlap the display screen DA of the display module 2 is needed and thus a plane size of the display apparatus 1 may increase.

However, in the display apparatus 1 according to an example, the plurality of light emitters 31a and 31b and the plurality of light receivers 32a and 32b are arranged behind the display module 2 and thus may be arranged in a region overlapping the display screen DA of the display module 2 as well as a region which does not overlap the display screen DA of the display module 2. An increase in the plane size of the display apparatus 1 may be prevented when the plurality of light emitters 31a and 31b and the plurality of light receivers 32a and 32b are arranged in the region overlapping the display screen DA of the display module 2.

Figure 3:
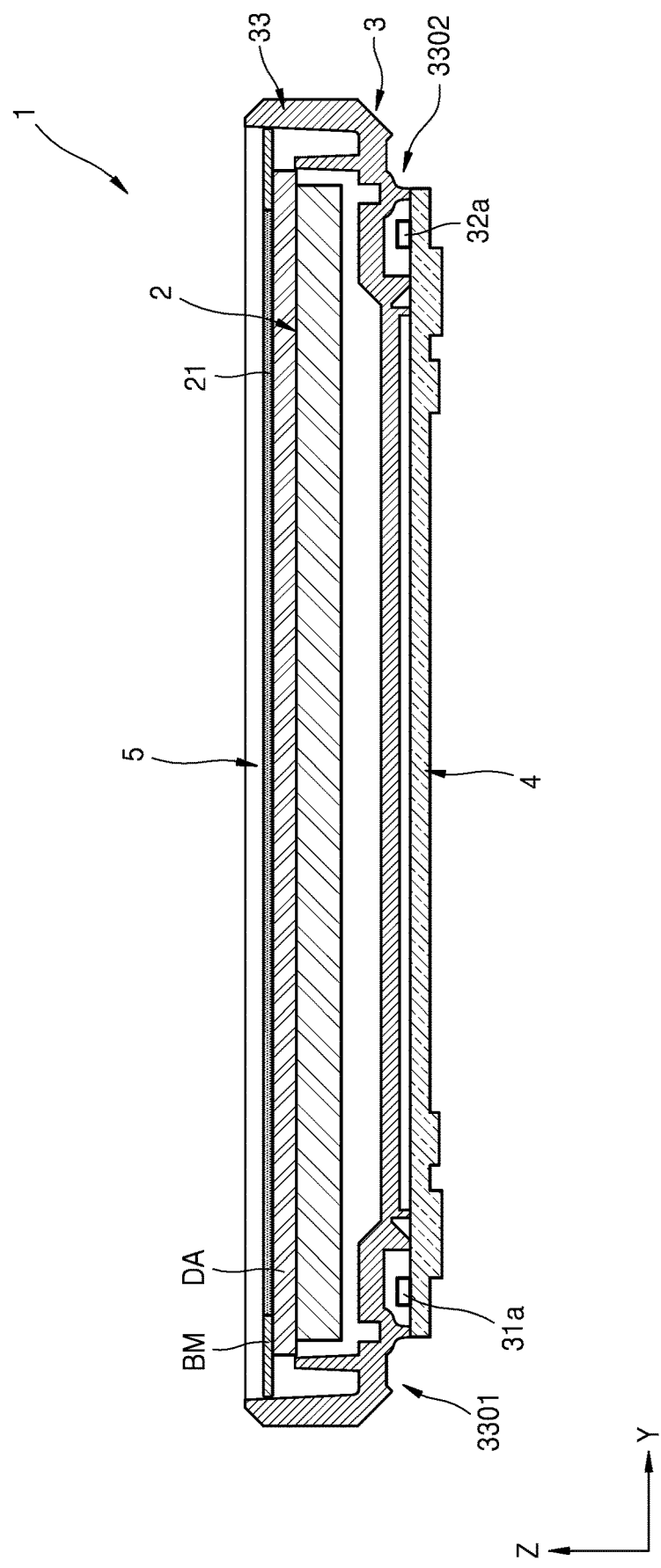
FIG. 3 is a cross-sectional view of a display apparatus according to an example.
Figure 4A:
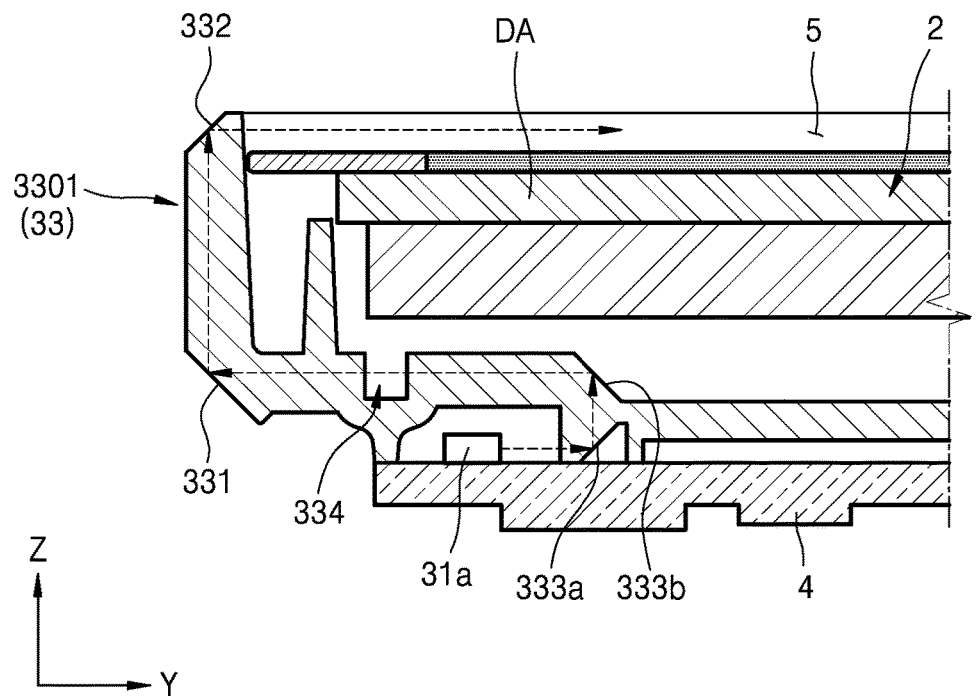
FIGS. 4A and 4B are partially enlarged views of FIG. 3 for explaining a light guide member.
Figure 4B:
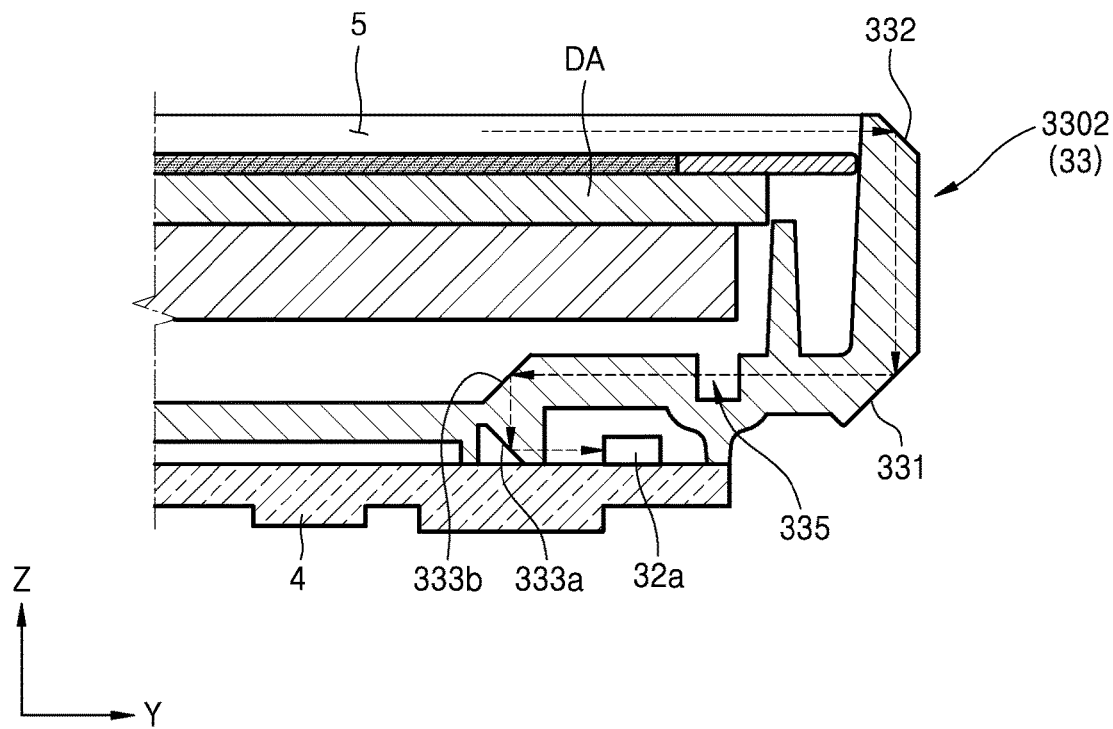

FIG. 3 is a cross-sectional view of the display apparatus 1 according to an example. FIGS. 4A and 4B are partially enlarged views of FIG. 3 for explaining the light guide member 33. FIG. 3 is a cross-sectional view taken along line II-II of the display apparatus 1 of FIG. 1.

Referring to FIG. 3, the light guide member 33 includes a first light guide portion 3301 to guide infrared rays emitted from the plurality of light emitters 31a and 31b to the touch space 5, and a second light guide portion 3302 to guide the infrared rays emitted into the touch space 5 to the plurality of light receivers 32a and 32b.

The first and second light guide portions 3301 and 3302 may be formed of infrared permeable materials. For example, the first and second light guide portions 3301 and 3302 may have infrared transmittance of 50% or more, and may for example, have infrared transmittance of 90% or more. For example, the first and second light guide portions 3301 and 3302 may include polycarbonate (PC).

Some regions of the first and second light guide portions 3301 and 3302 may extend in forward and backward directions and the other regions thereof may extend in directions perpendicular to the forward and backward directions. For example, a whole shape of each of the first and second light guide portions 3301 and 3302 may be an 'L' shape.

Referring to FIGS. 4A and 4B, reflective surfaces 331, 332, 333a, and 333b may be provided at the first and second light guide portions 3301 and 3302. The reflective surfaces 331, 332, 333a, and 333b may reflect infrared rays.

Figure 5A:
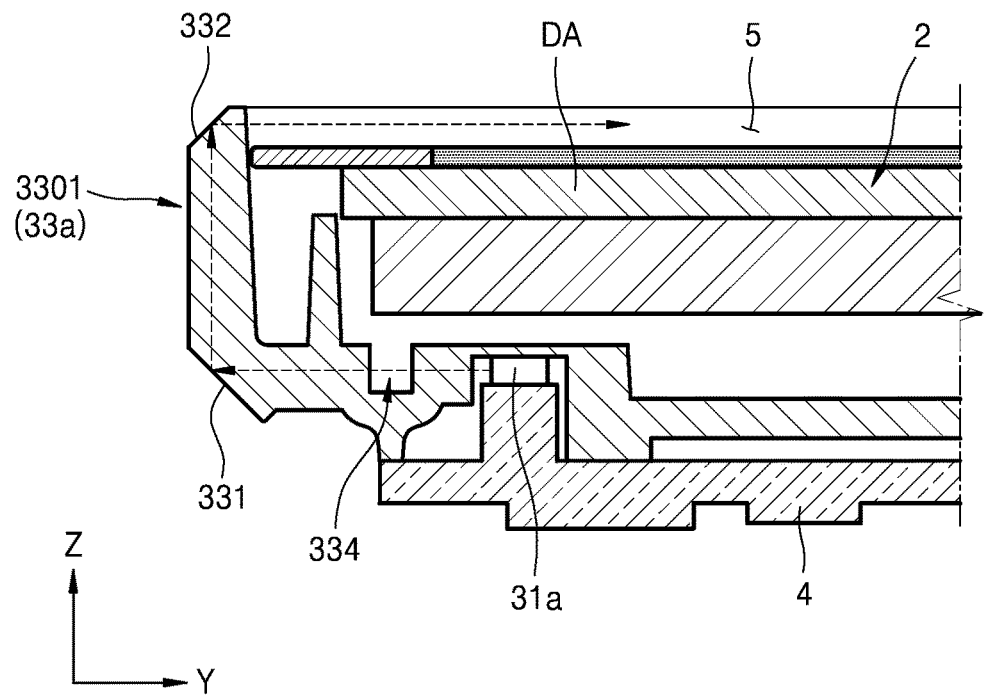
FIGS. 5A and 5B are partially enlarged cross-sectional views for explaining a light guide member according to another example.

Referring to FIG. 4A, the first light guide portion 3301 may include the first reflective surface 331 reflecting infrared rays in a forward direction, and the second reflective surface 332 reflecting infrared rays toward the touch space 5. The first light guide portion 3301 may further include third reflective surfaces 333a and 333b reflecting infrared rays emitted from the plurality of light emitters 31a and 31b to the first reflective surface 331. However, the third reflective surfaces 333a and 333b may be provided according to a length of a path of light, and may be omitted in a light guide member 33a as illustrated in FIG. 5A.

Figure 5B:
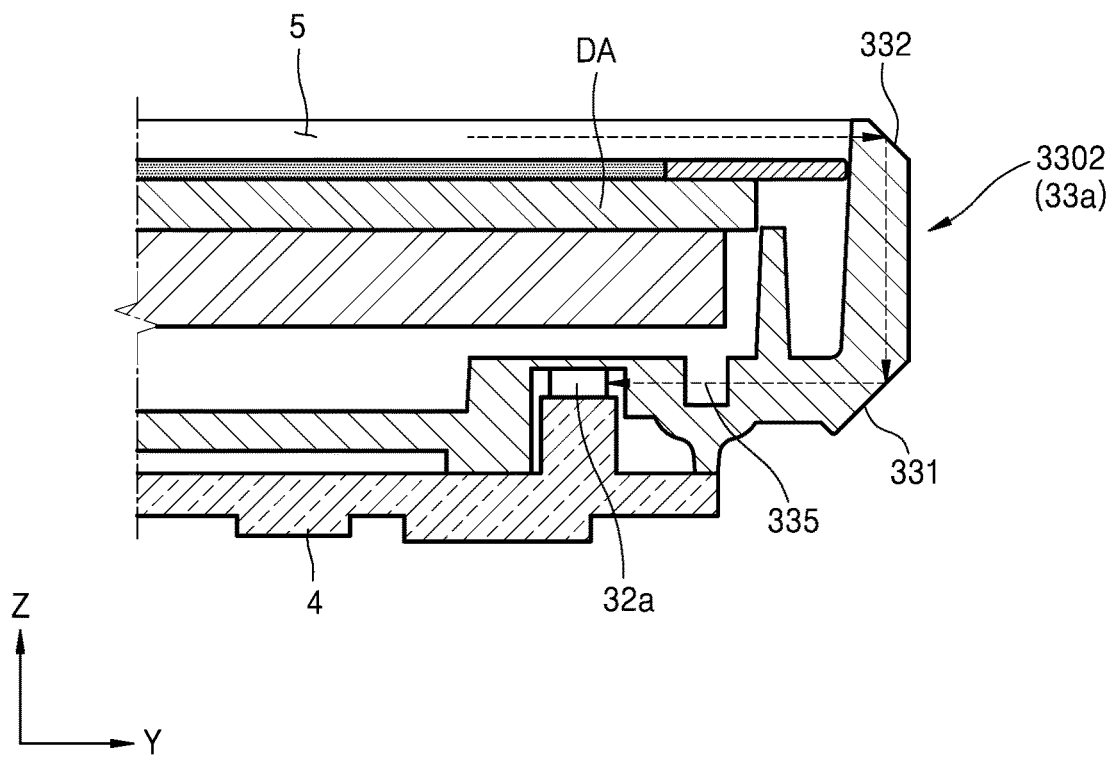

Referring to FIG. 4B, the second light guide portion 3302 includes the second reflective surface 332 reflecting infrared rays emitted into the touch space 5 in a backward direction, and the first reflective surface 331 reflecting infrared rays in a direction parallel to the display panel 22. The second light guide portion 3302 may further include the third reflective surfaces 333a and 333b reflecting infrared rays reflected from the first reflective surface 331 to the plurality of light receivers 32a and 32b. However, the third reflective surfaces 333a and 333b may be provided according to a length of a path of light, and may be omitted in the light guide member 33a as illustrated in FIG. 5B.

Referring back to FIG. 2, the plurality of light emitters 31a and 31b are arranged on the printed circuit board 4 to be apart from each other. The light emitters 31a among the plurality of light emitters 31a and 31b are arranged in a first direction, e.g., an X-axis direction, and the other light emitters 31b are arranged in a second direction perpendicular to the first direction, e.g., a Y-axis direction.

The plurality of light receivers 32a and 32b are arranged apart from each other at locations on the printed circuit board 4 opposite the plurality of light emitters 31a and 31b. The light receives 32a among the plurality of light receivers 32a and 32b are arrange in the first direction, e.g., the X-axis direction, to be apart from the light emitter 31a. The other light receivers 32b are arranged in the second direction, e.g., the Y-axis direction, to be apart from the light emitter 31b.

The plurality of light emitters 31a and 31b may emit infrared rays in a direction parallel to a direction of a plane of the printed circuit board 4. For example, the light emitters 31a arranged in the X-axis direction may emit infrared rays in the Y-axis direction, and the light emitters 31b arranged in the Y-axis direction may emit infrared rays in the X-axis direction.

The plurality of light receivers 32a and 32b may receive infrared rays in a direction parallel to the direction of the plane of the printed circuit board 4. For example, the light receivers 32a arranged in the X-axis direction may receive infrared rays in the Y-axis direction, and the light receivers 32b arranged in the Y-axis direction may receive infrared rays in the X-axis direction.

However, when a width of infrared rays emitted from the light emitters 31a and 31b is less than the distances between adjacent light emitters 31a and 31b, a blind region to which light is not emitted may exist between the infrared rays emitted from the adjacent light emitters 31a and 31b. Touch recognition may not be capable of being performed on the blind region.

However, referring to FIGS. 2 and 4A, in the display apparatus 1 according to an example, the first light guide portion 3301 includes a diffusion region 334 to diffuse infrared rays emitted from the light emitters 31a and 31b. The diffusion region 334 may diffuse the infrared rays emitted from adjacent light emitters 31a and 31b to overlap each other. Thus, even when the plurality of light emitters 31a and 31b are arranged apart from each other, a blind region in which touch recognition cannot be performed may be prevented from occurring.

Referring to FIGS. 2 and 4B, the second light guide portion 3302 includes a light collection region 335 to collect the diffused infrared rays such that the diffused infrared rays may be received by the light receivers 32a and 32b without being lost.

The diffusion region 334 and the light collection region 335 of the light guide member 33 may be located behind the display module 2. Thus, in the light guide member 33, the second reflective surface 332 is provided in front of the display module 2.

If the diffusion region 334 and the light collection region 335 are arranged in front of the display module 2, a space in which the diffusion region 334 and the light collection region 335 may be arranged not to overlap the display screen DA of the display module 2 is needed and thus a plane size of the display apparatus 1 may be increased.

However, in the display apparatus 1 according to an example, since the diffusion region 334 and the light collection region 335 are arranged behind the display module 2, the diffusion region 334 and the light collection region 335 may be arranged in a region which does not overlap the display screen DA of the display module 2 as well as a region which overlaps the display screen DA of the display module 2. Accordingly, an increase in the plane size of the display apparatus 1 may be prevented.

As described above, the light emitters 31a and 31b, the light receivers 32a and 32b, the diffusion region 334, and the light collection region 335 are arranged behind the display module 2 and thus the occurrence of a blind region may be prevented while minimizing a thickness of a bezel of the display apparatus 1.

Furthermore, since the light guide member 33 is arranged surrounding an edge of the display module 2, a user would feel as if a depth of the touch space 5 of the display apparatus 1 is less than an actual depth thereof, when compared to a structure in which a portion of the light guide member 33 is located in front of the display module 2.

Referring back to FIGS. 1 and 2, in the display apparatus 1, the light guide member 33 may surround the perimeter of the display module 2 and may be exposed to the outside of the display apparatus 1. The display apparatus 1 may be used without combining an outer side of the light guide member 33 with an additional case. That is, the light guide member 33 may serve as a part of a case. The light guide member 33 may function as a case covering an edge of the display apparatus 1.

Since the display apparatus 1 does not include an additional case for the outer side of the light guide member 33, the plane size of the display apparatus 1 may be decreased. Furthermore, costs and workload for manufacturing an additional case may be removed.

The light guide member 33 may include a material which may function as a case as well as guide the propagation of infrared rays. For example, the light guide member 33 may be formed of a material having strength enough to function as a case and having infrared permeability to guide the propagation of infrared rays. For example, the light guide member 33 may include polycarbonate (PC).

The printed circuit board 4 is provided behind the light guide member 33. The plurality of light emitters 31a and 31b and the plurality of light receivers 32a and 32b are mounted on the printed circuit board 4. The printed circuit board 4 may be formed of an insulating material having a certain degree of hardness. For example, the printed circuit board 4 may include phenol resin or epoxy resin.

As described above, materials of the light guide member 33 and the printed circuit board 4 are different. Thus, the light guide member 33 and the printed circuit board 4 are separately manufactured and assembled together to manufacture the display apparatus 1.

As described above, the plurality of light emitters 31a and 31b and the plurality of light receivers 32a and 32b are arranged on the printed circuit board 4, and the light guide member 33 includes the first and second light guide portions 3301 and 3302. Thus, how infrared rays emitted from the light emitters 31a and 31b are incident on the first light guide portion 3301 and how the incident infrared rays are emitted to the touch space 5 may vary according to a method of assembling the printed circuit board 4 and the light guide member 33.

Figure 6A:
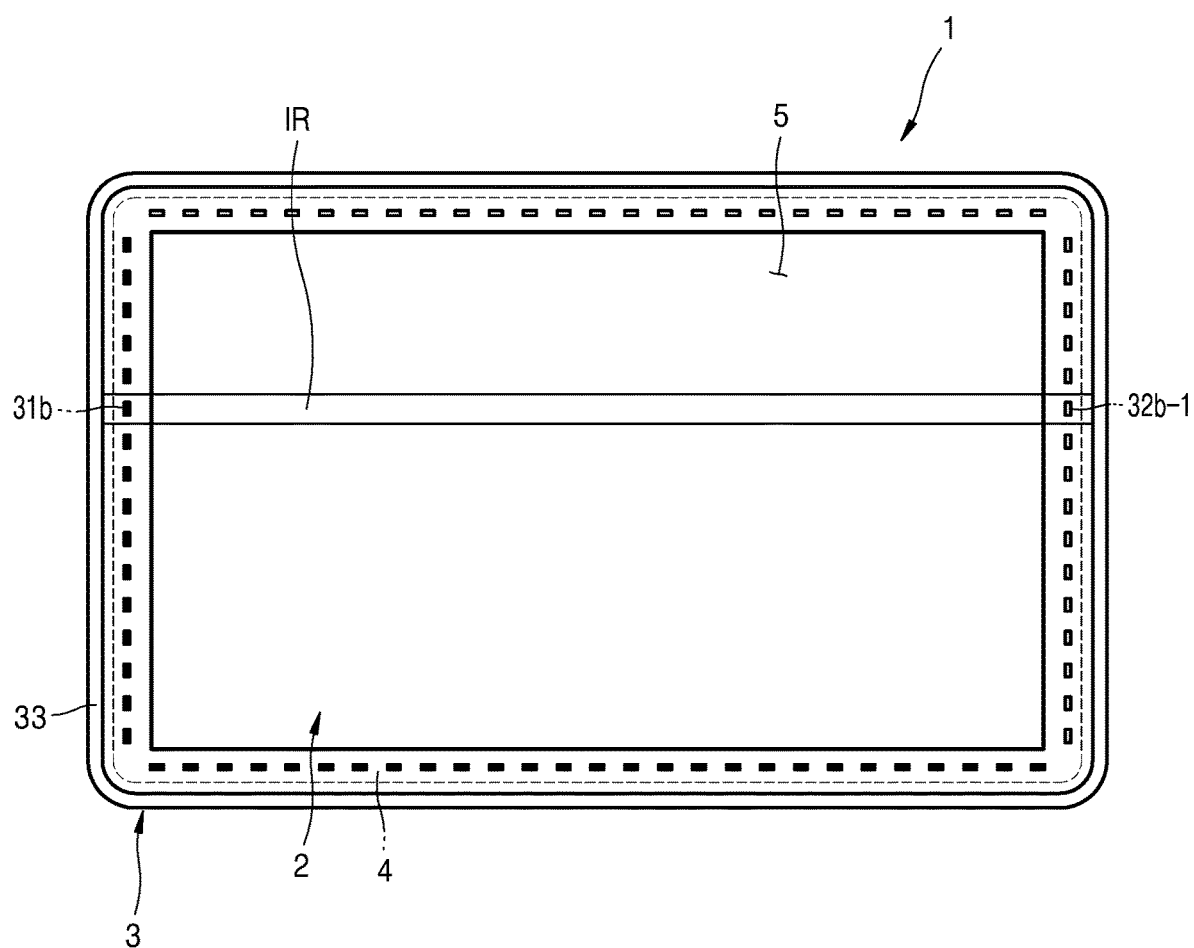
FIGS. 6A and 6B are diagrams illustrating a path of light in a touch space, according to an assembled state of a light guide member and a printed circuit board.
Figure 6B:
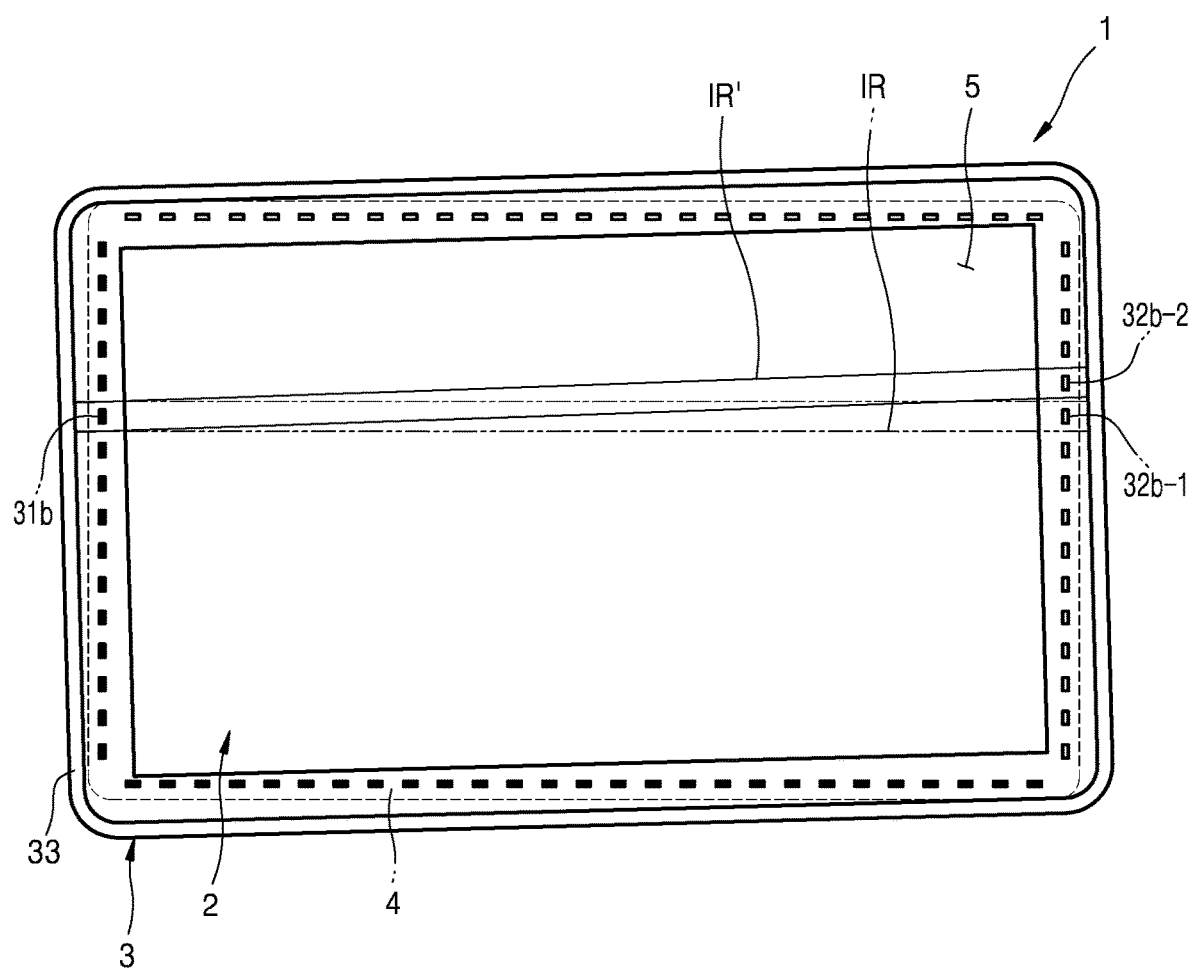

FIGS. 6A and 6B are diagrams illustrating a path of light in the touch space 5 according to an assembled state of the light guide member 33 and the printed circuit board 4.

Referring to FIG. 6A, when the printed circuit board 4 and the light guide member 33 are assembled together at a predetermined location, infrared rays IR are emitted to the touch space 5 in a normal path. The infrared rays IR are emitted from a light emitter 31*b* to the touch space 5 via the first light guide portion 3301 of the light guide member 33. The infrared rays IR emitted to the touch space 5 are received by a light receiver 32*b*-1 located at a location corresponding to the light emitter 31*b* via the second light guide portion 3302.

Referring to FIG. 6B, when the light guide member 33 and the printed circuit board 4 are assembled away from the predetermined location, infrared rays IR' emitted into the touch space 5 via the light guide member 33 may deviate from a normal path of light. Thus, infrared rays IR emitted from the light emitter 31*b* may be received not by the light receiver 32*b*-1 corresponding to the light emitter 31*b* but by a light receiver 32*b*-2.

Accordingly, in the display apparatus 1 according to an example, the light guide member 33 and the printed circuit board 4 need to be assembled together at the predetermined location.

Figure 7A:
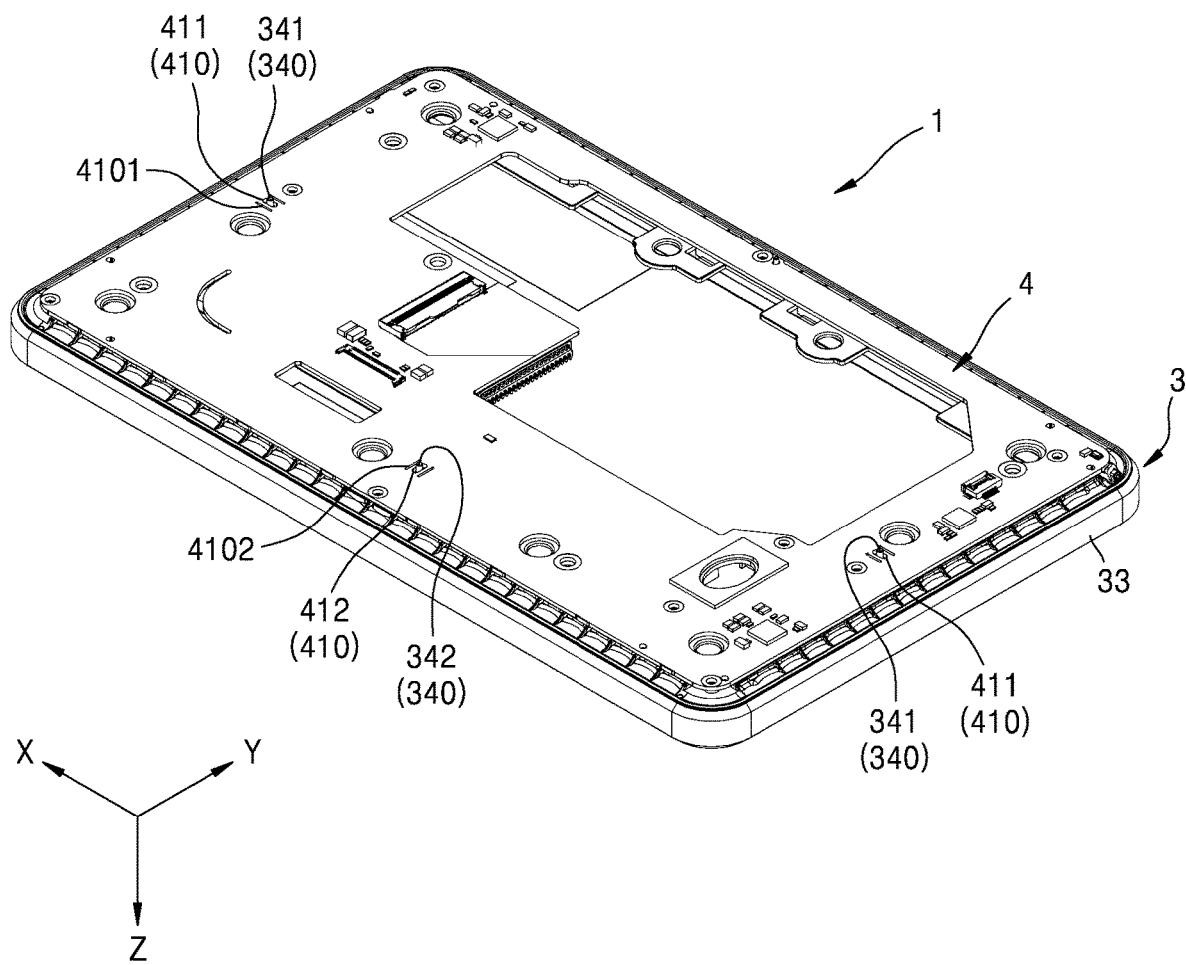
FIGS. 7A and 7B are respectively an assembled perspective view and an exploded perspective view of a display apparatus according to an example, when viewed at different angles.
Figure 7B:
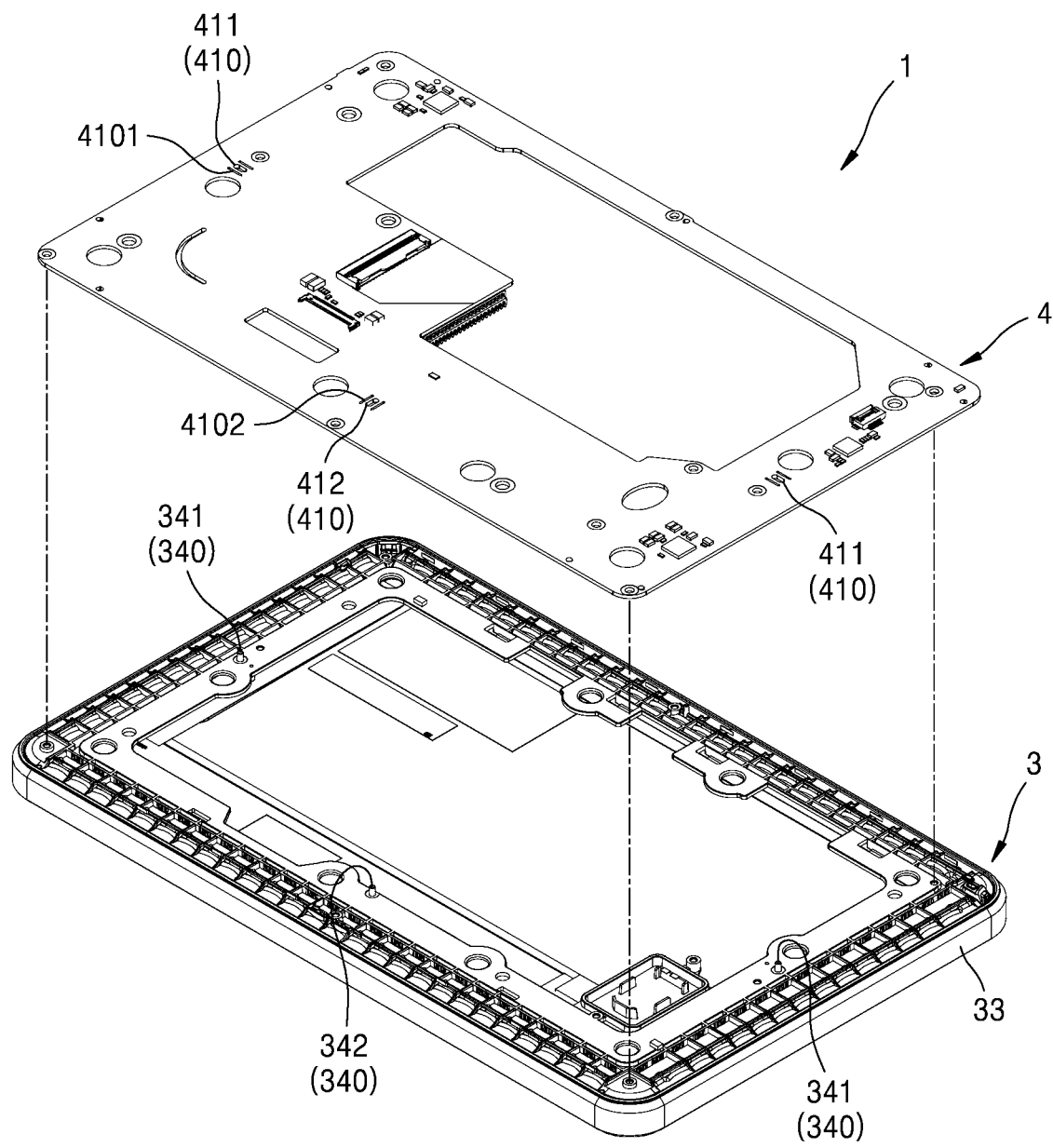
Figure 8:
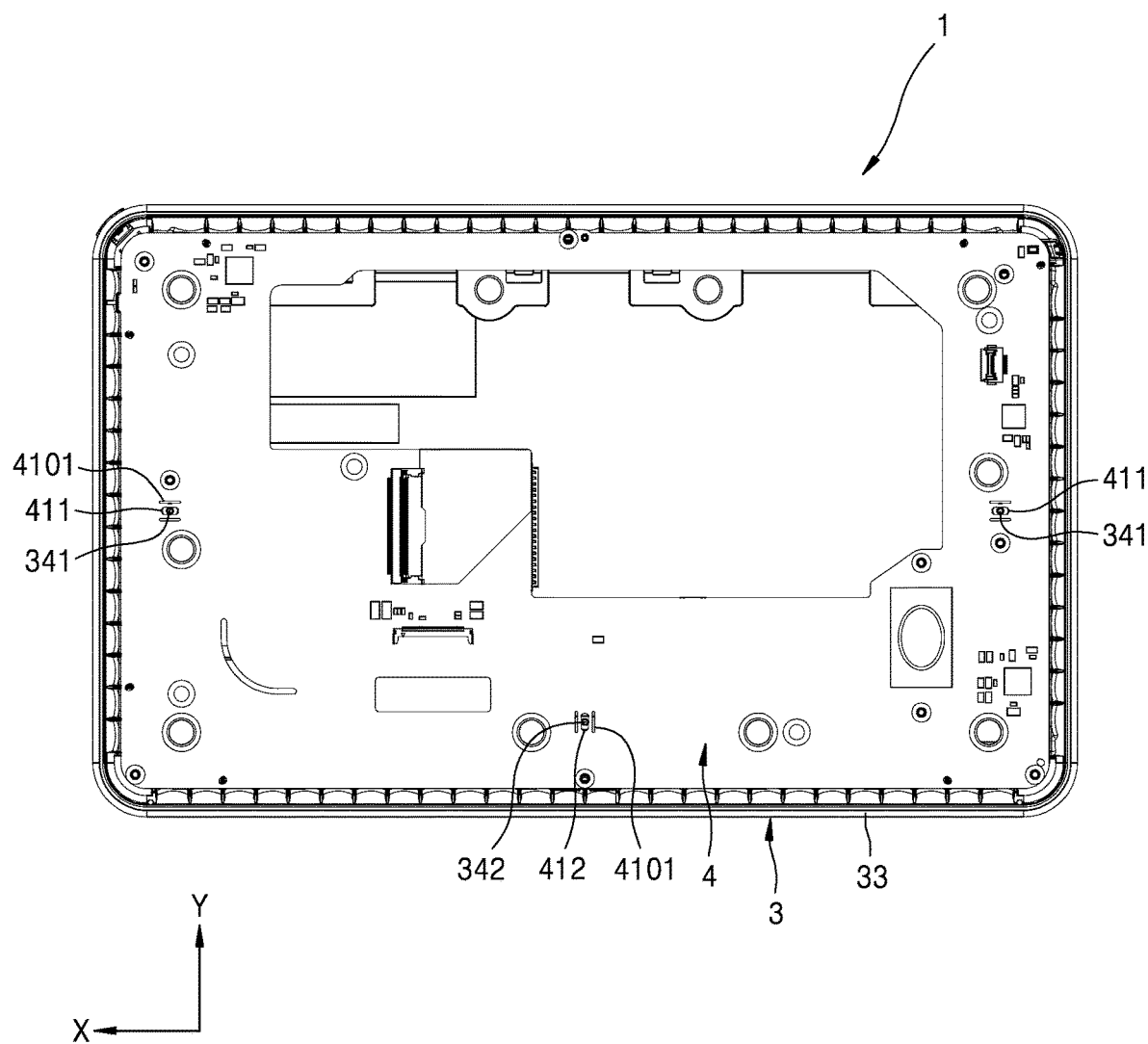
FIG. 8 is a rear view of a display apparatus according to an example.

FIGS. 7A and 7B are an assembled perspective view and an exploded perspective view of the display apparatus 1 according to an example, when viewed at different angles. FIG. 8 is a rear view of the display apparatus 1 according to an example, when viewed from the rear thereof.

Referring to FIGS. 7A, 7B, and 8, in one example, the light guide member 33 and the printed circuit board 4 may include coupling structures to couple the light guide member 33 and the printed circuit board 4 to each other.

The coupling structures may include a plurality of coupling protrusions 340, and a plurality of coupling holes 410 to be combined with the plurality of coupling protrusions 340. For example, the light guide member 33 may include the plurality of coupling protrusions 340 and the printed circuit board 4 may include the plurality of coupling holes 410.

The printed circuit board 4 and the light guide member 33 may include at least three coupling holes 410 and at least three coupling protrusions 340 to prevent the printed circuit board 4 and the light guide member 33 from being deviated in a plane direction, e.g., a direction toward an XY plane.

For example, in the printed circuit board 4, two first coupling holes 411 are formed apart from each other in a first direction, e.g., an X-axis direction, and a second coupling hole 412 is formed between the two first coupling holes 411 to be apart from the first coupling holes 411 in a second direction, e.g., a Y-axis direction. The two first coupling holes 411 are formed at left and right sides of the printed circuit board 4 and the second coupling hole 412 is formed at a lower side thereof.

For example, in the light guide member 33, two first coupling protrusions 341 are provided to be combined with the two first coupling holes 411, and a second coupling protrusion 342 is provided to be combined with the second coupling hole 412. Each of the first coupling protrusions 341 may be formed at a midpoint on one of left and right sides of the light guide member 33 in the Y-axis direction. The second coupling protrusion 342 may be formed at a midpoint on a lower side of the light guide member 33 in the X-axis direction.

Movement of the printed circuit board 4 and the light guide member 33 in the Y-axis direction may be limited by combining the two first coupling protrusions 341 with the two first coupling holes 411, and movement thereof in the X-axis direction may be limited by combining the second coupling protrusion 342 with the second coupling hole 412.

However, during separate manufacture of the light guide member 33 and the printed circuit board 4, the coupling protrusions 340 and the coupling holes 410 are actually difficult to precisely manufacture according to predetermined measurements thereof. That is, manufacturing errors may occur in the predetermined measurements during the manufacture of the light guide member 33 and the printed circuit board 4. For example, the coupling protrusions 340 may be manufactured with a margin of error of ±0.05 mm, and the coupling holes 410 may be manufactured with a margin of error of ±0.03 mm.

Due to the manufacturing errors, the coupling holes 410 may be smaller or larger than the coupling protrusions 340. For example, when the coupling holes 410 are manufactured smaller than the coupling protrusion 340, the coupling protrusions 340 cannot be inserted into the coupling holes 410 and thus may not be combined with the coupling holes 410. In contrast, when the coupling holes 410 are manufactured greater than the coupling protrusions 340, the positions of the light guide member 33 and the printed circuit board 4 may not match each other due to gaps between the coupling protrusions 340 and the coupling holes 410.

If the light guide member 33 is to function merely as a case, such minor manufacturing errors may be ignored during manufacture. However, since the light guide member 33 is to function as a case as well as guide the propagation of infrared rays, the light guide member 33 may need to be assembled at the predetermined location with the printed circuit board 4 on which the light emitters 31*a* and 31*b* and the light receivers 32*a* and 32*b* are arranged.

In one example, an interference fit between the printed circuit board 4 and the light guide member 33 may be provided through elastic deformation of at least one thereof. For example, the coupling holes 410 of the printed circuit board 4, the coupling protrusions 340 of the light guide member 33, or a support region 343 supporting the coupling protrusion 340 may be elastically deformed such that an interference fit is formed between the coupling protrusions 340 and the coupling holes 410.

When the coupling protrusions 340 are not combined with the coupling holes 410, a width of the coupling holes 410 may be less than that of the coupling protrusions 340. When the coupling protrusion 340 are combined with the coupling hole 410, the width of the coupling holes 410 may become equal to that of the coupling protrusions 340.

Figure 9A:
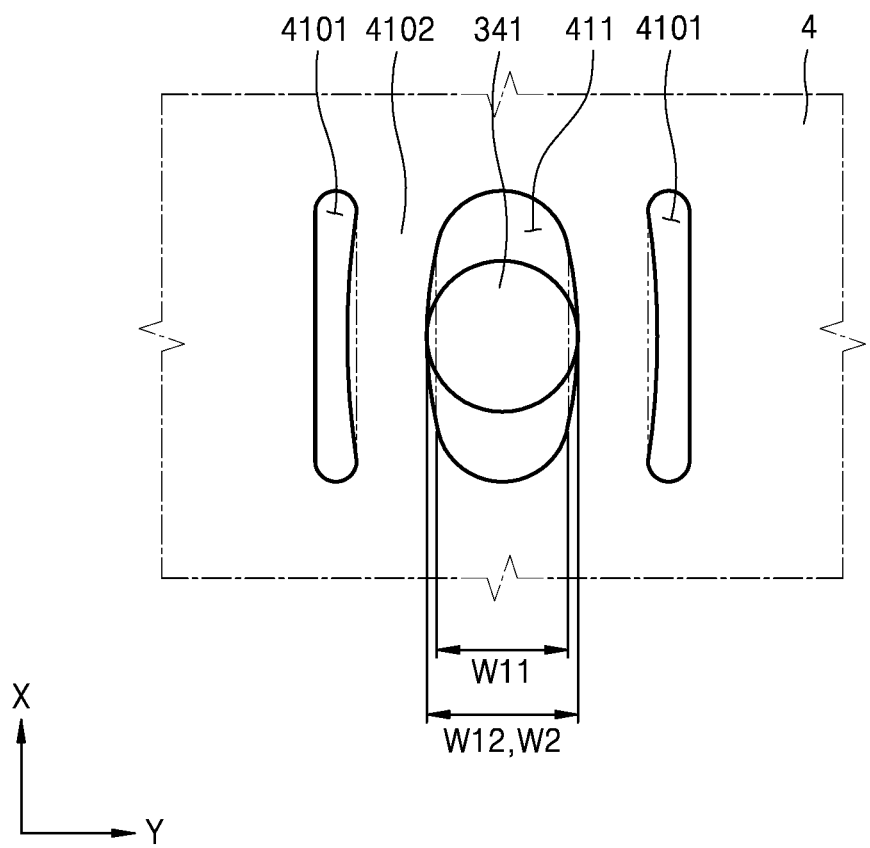
FIGS. 9A and 9B are diagrams for explaining coupling structures according to an example.
Figure 9B:
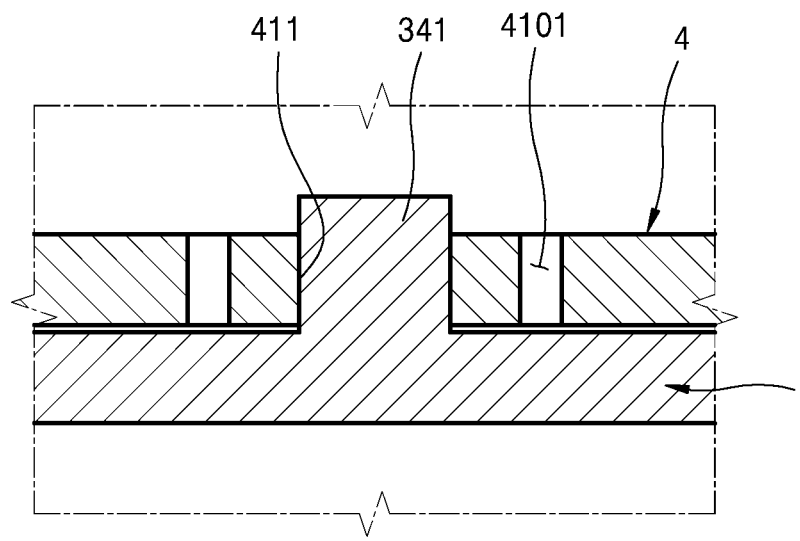

FIGS. 9A and 9B are diagrams for explaining coupling structures according to an example. FIG. 9B is a cross-sectional view of FIG. 9A. In FIGS. 9A and 9B, a coupling hole 410, e.g., a first coupling hole 411, formed in a printed circuit board 4 may be in the form of a long hole. For example, a length of the first coupling hole 411 in an X-axis direction may be greater than a length thereof in a Y-axis direction.

During combining of a first coupling protrusion 341 with the first coupling hole 411, the printed circuit board 4 may be elastically deformed and thus a width of the coupling hole 410 may be increased. The first coupling hole 411 has a width W11 less than a diameter W2 of the first coupling protrusion 341 before the first coupling protrusion 341 is inserted thereinto, and has a width W12 equal to the diameter W2 of the first coupling protrusion 341 after the first coupling protrusion 341 is inserted thereinto.

The printed circuit board 4 may include first auxiliary coupling holes 4101 formed around the first coupling hole 411 in the Y-axis direction. As the first auxiliary coupling holes 4101 are formed around the first coupling hole 411, a width of a peripheral region 4102 of the first coupling hole 411 decreases. As the width of the peripheral region 4102 decreases, elastic deformation occurs more easily. Thus, the width of the first coupling hole 411 may be increased during the insertion of the first coupling protrusion 341 into the first coupling hole 411.

Accordingly, during the insertion of the first coupling protrusion 341 into the first coupling hole 411, the peripheral region 4102 between the first coupling hole 411 and the first auxiliary coupling hole 4101 in the printed circuit board 4 is elastically deformed, and thus an interference fit is formed between the first coupling protrusion 341 and the first coupling hole 411. Thus, the movement of the light guide member 33 having the first coupling protrusions 341 in the Y-axis direction is limited.

Although coupling between the first coupling protrusion 341 and the first coupling hole 411 has been described above with reference to FIGS. 9A and 9B, the second coupling protrusion 342 and the second coupling hole 412 may be also coupled to each other, similarly to the first coupling protrusion 341 and the first coupling hole 411.

Figure 10A:
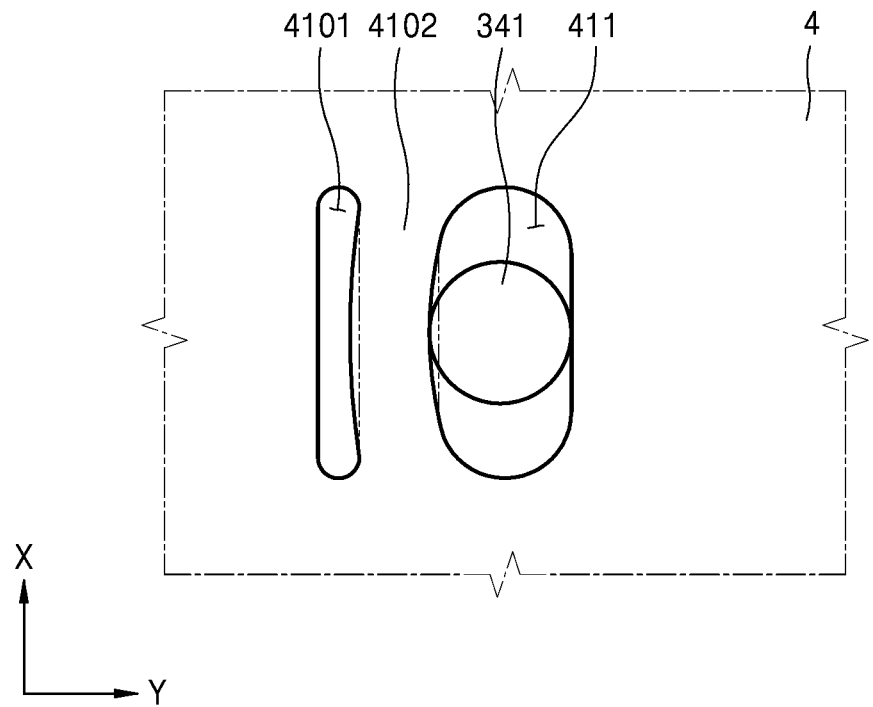
FIGS. 10A and 10B are diagrams for explaining coupling structures according to another example.
Figure 10B:
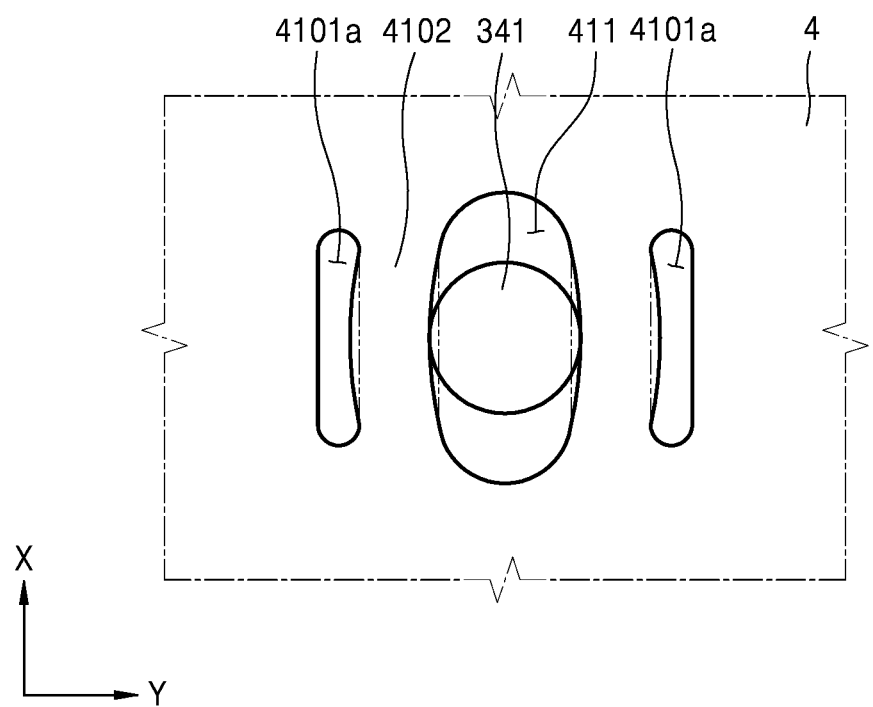

In the above example, the first auxiliary coupling holes 4101 are located at opposite sides of the first coupling hole 411 and a length of the first auxiliary coupling holes 4101 is equal to that of the first coupling hole 411. However, the arrangement and length of the first auxiliary coupling holes 4101 are not limited thereto and may be variously changed. For example, the first auxiliary coupling hole 4101 may be located at a side of the first coupling hole 411 as illustrated in FIG. 10A or a length of the first auxiliary coupling hole 4101a may be different from that of the first coupling hole 411 as illustrated in FIG. 10B. Furthermore, although not shown, when a peripheral region of the first coupling hole 411 has a narrow width enough to be elastically deformed, the first auxiliary coupling hole 4101 may be omitted.

Referring back to FIG. 8, an interference fit may be provided between two first coupling protrusions 341 and two first coupling holes 411 to limit the movement of the light guide member 33 relative to the printed circuit board 4 in the Y-axis direction, and an interference fit may be provided between one second coupling protrusion 342 and one second coupling hole 412 to limit the movement of the light guide member 33 relative to the printed circuit board 4 in the X-axis direction. Accordingly, the light guide member 33 and the printed circuit board 4 may be prevented from being incorrectly meshed with each other during assembly thereof as illustrated in FIG. 6B.

Formation of an interference fit between the coupling hole 410 and the coupling protrusion 340 through deformation of the coupling holes 410 in the printed circuit board 4 has been described above in the above example. However, a coupling structure for forming an interference fit between the coupling hole 410 and the coupling protrusion 340 is not limited thereto. For example, the coupling protrusion 340 or the support region 343 supporting the coupling protrusion 340 may be elastically deformed to combine the coupling protrusion 340 and the coupling hole 410 with each other.

Figure 11A:
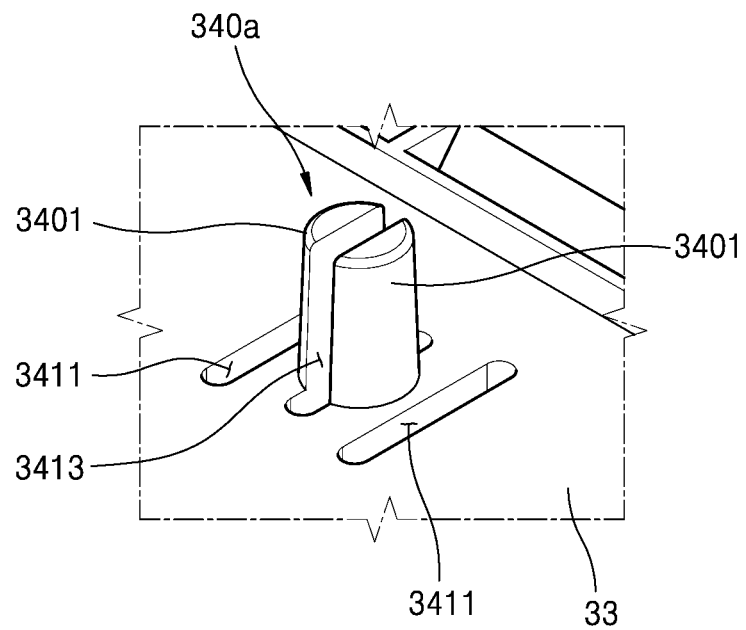
FIGS. 11A and 11B are respectively a partial perspective view and a plan view of a light guide member having an elastically deformable coupling protrusion.
Figure 11B:
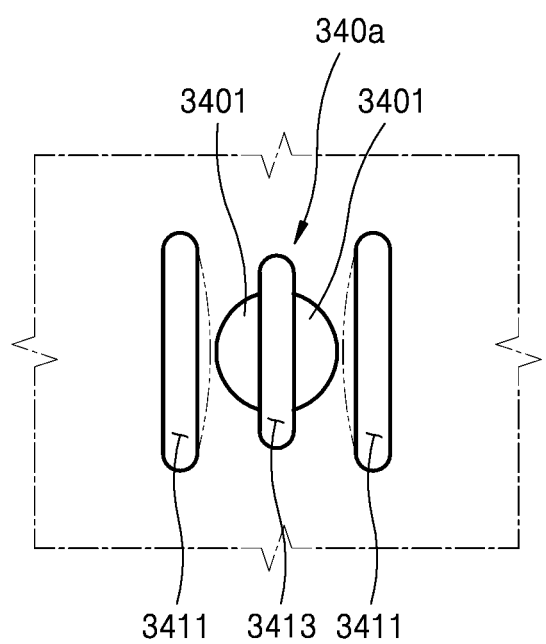
Figure 12:
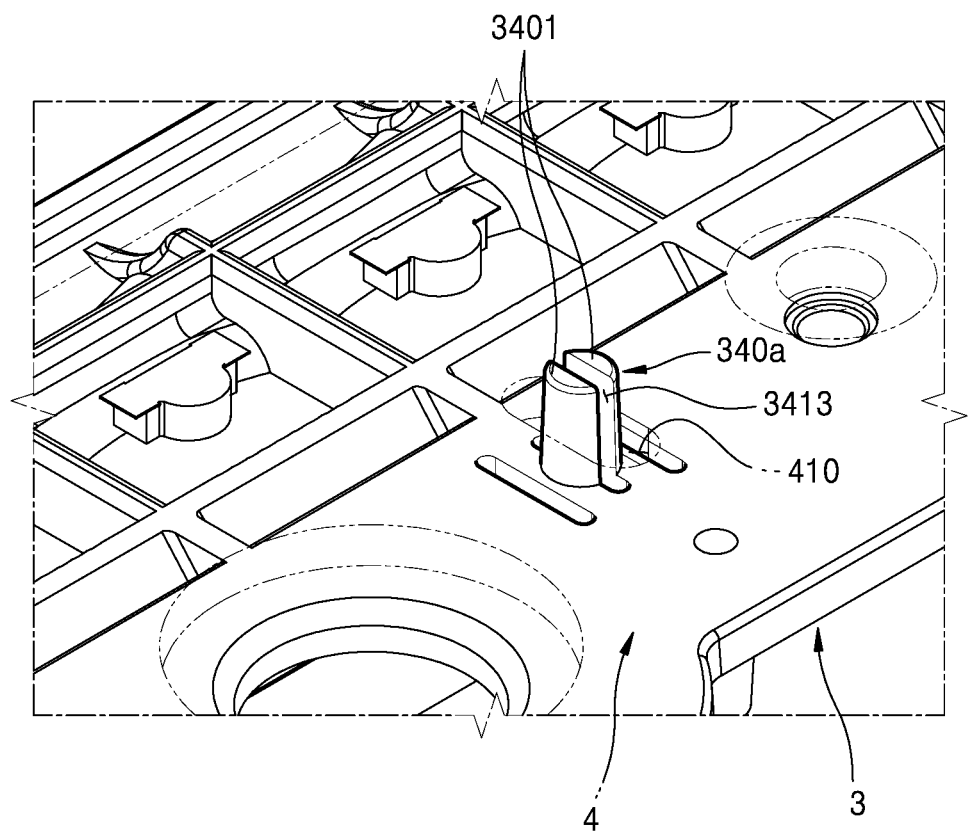
FIG. 12 is a perspective view illustrating a state in which the coupling protrusion of FIG. 11A is combined with a coupling hole.

FIGS. 11A and 11B are a partial perspective view and a plan view of a light guide member 33 having an elastically deformable coupling protrusion 340a. FIG. 12 is a perspective view illustrating a state in which the coupling protrusion 340 of FIG. 11A is combined with the coupling hole 410.

Referring to FIGS. 11A and 11B, the coupling protrusion 340a is provided on the light guide member 33. The coupling protrusion 340a may be elastically deformed and a width thereof may change during combining of the coupling protrusion 340a with the coupling hole 410 (see FIG. 12).

The coupling protrusion 340a may include a plurality of cantilever 3401 arranged apart from each other. For example, the coupling protrusion 340a may include two cantilevers 3401 spaced apart from each other. A cross section of the cantilever 3401 may be in the form of segment of a circle.

In the light guide member 33, at least one second auxiliary coupling hole 3411 may be provided near the coupling protrusion 340a to help elastic deformation of the coupling protrusion 340a. For example, two second auxiliary coupling holes 3411 may be provided near the coupling protrusion 340a in the light guide member 33.

Referring to FIG. 12, during the combining of the coupling protrusion 340a with the coupling hole 410, the cantilevers 3401 of the coupling protrusion 340a are pressurized due to the coupling hole 410. A space 3413 is provided between the cantilevers 3401 and thus the pressurized cantilevers 3401 are elastically deformed such that they come close to each other. Thus, the width of the coupling protrusion 340a is decreased during the insertion thereof into the coupling hole 410 and an interference fit is formed between the coupling protrusion 340a and the coupling hole 410.

Figure 13:
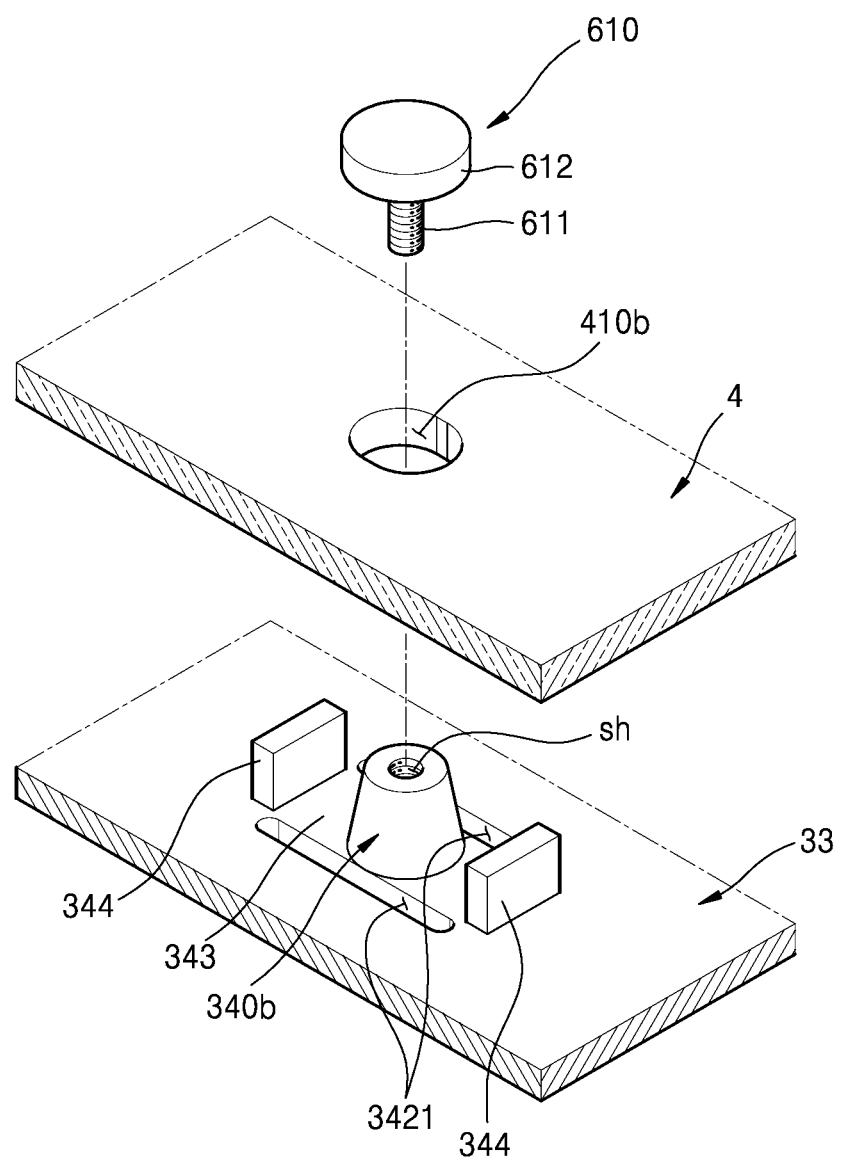
FIG. 13 is a diagram for explaining a coupling structure according to another example.
Figure 14A:
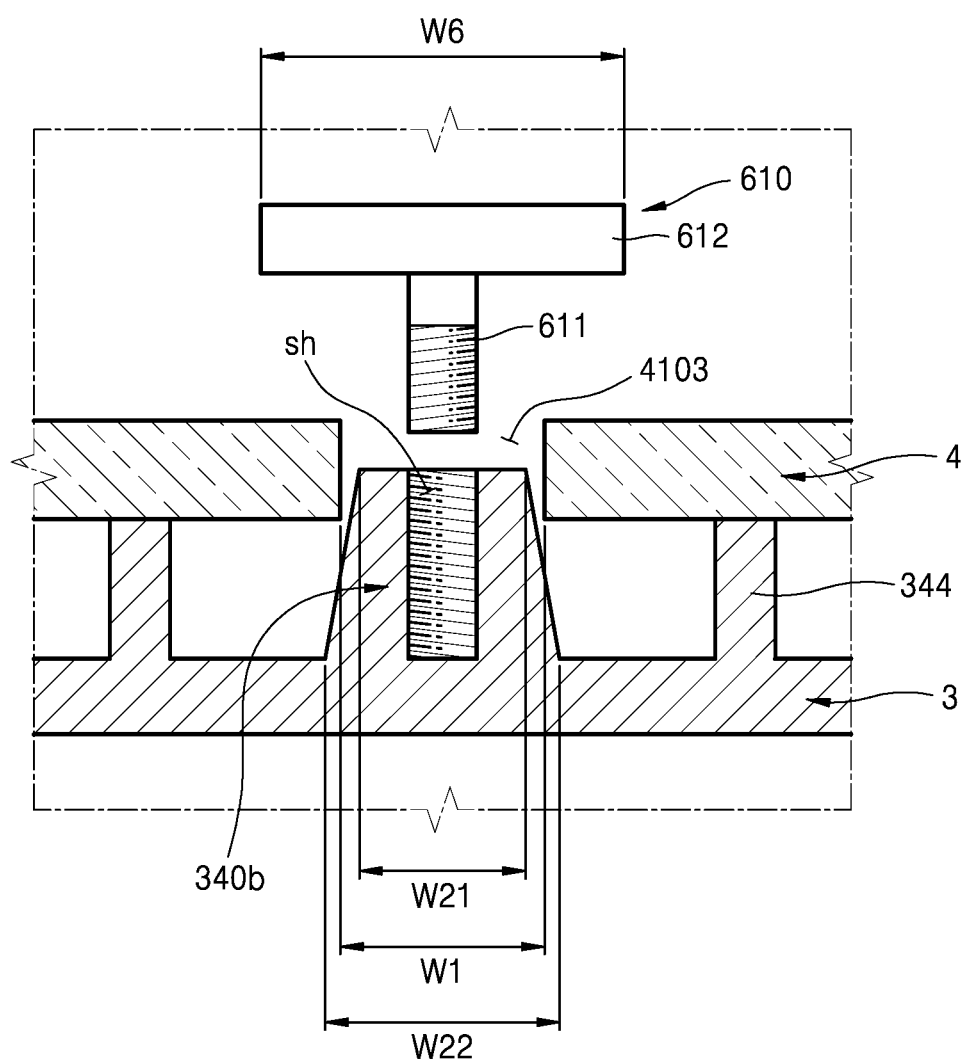
FIGS. 14A and 14B are diagrams for explaining an operation of the coupling structure of FIG. 13.
Figure 14B:
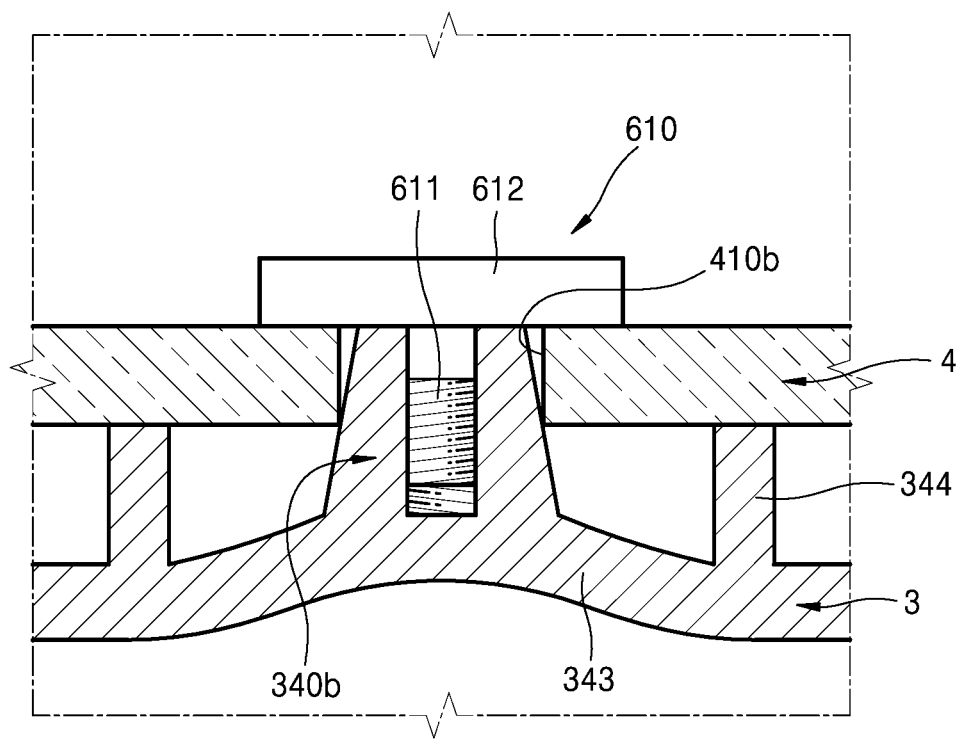

FIG. 13 is a diagram for explaining a coupling structure according to another example. FIGS. 14A and 14B are diagrams for explaining an operation of the coupling structure of FIG. 13.

Referring to FIG. 13, a light guide member 33 includes a coupling protrusion 340b, third auxiliary coupling holes 3421 near the coupling protrusion 340b, and a spacer 344 protruding toward a printed circuit board 4.

An external diameter of the coupling protrusion 340b changes in a direction in which it protrudes, e.g., an upward direction. For example, the external diameter of the coupling protrusion 340b decreases in the upward direction. For screw coupling, a screw hole sh is provided inside the coupling protrusion 340b.

Referring to FIGS. 13 and 14A, a coupling hole 410 is provided in the printed circuit board 4. A diameter W1 of the coupling hole 410 is greater than a minimum external diameter W21 of the coupling protrusion 340b and is less than a maximum external diameter W22 of the coupling protrusion 340b.

A screw 610 is fastened with the coupling protrusion 340b while the coupling protrusion 340b is inserted into the coupling hole 410. The screw 610 includes a screw portion 611 and a head portion 612. The screw portion 611 may be screw-coupled into the screw hole sh. A diameter W6 of the head portion 612 is greater than the diameter W1 of the coupling hole 410.

Referring to FIGS. 13 and 14B, when the head portion 612 of the screw 610 is turned while the screw portion 611 of the screw 610 is inserted into the screw hole sh of the coupling protrusion 340b, a force is applied to the coupling protrusion 340b in the upward direction due to a fastening force between the head portion 612 and the screw hole sh.

In this case, the support region 343 between the auxiliary coupling holes 3421 is elastically deformed in a state in which a distance between the printed circuit board 4 and the light guide member 33 is kept constant due to the spacer 344, and thus an outer circumferential surface of the coupling protrusion 340b comes into contact with the coupling hole 410. Accordingly, an interference fit is provided between the coupling protrusion 340b and the coupling hole 410, and thus the movement of the light guide member 33 and the printed circuit board 4 in a plane direction is limited.

Figure 15:
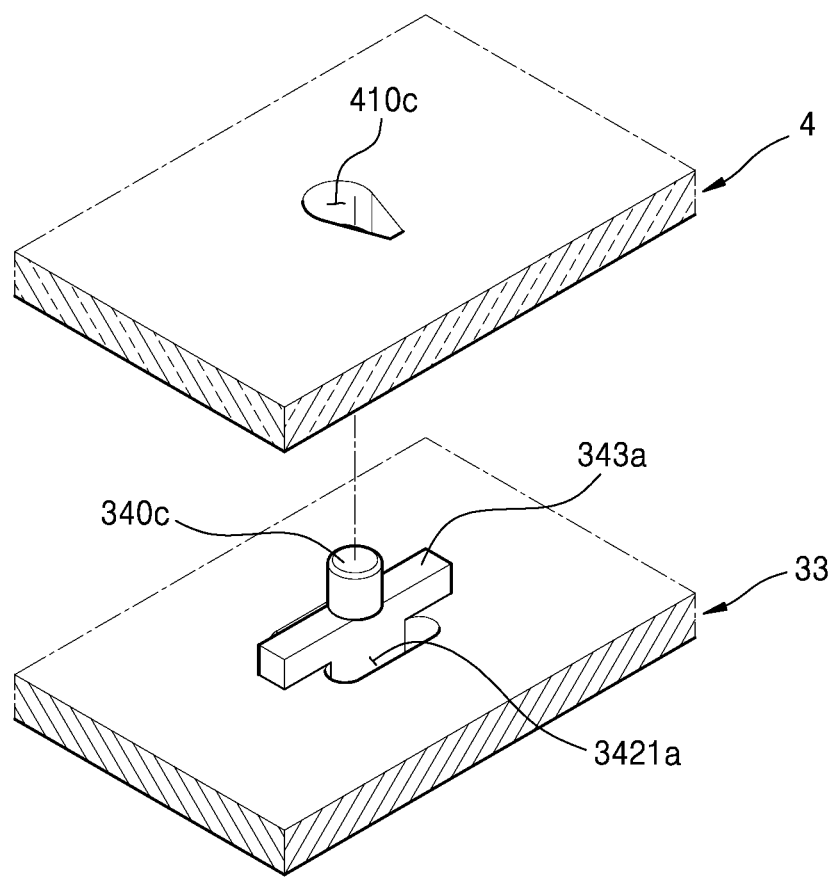
FIG. 15 is a diagram for explaining a coupling structure according to another example.
Figure 16A:
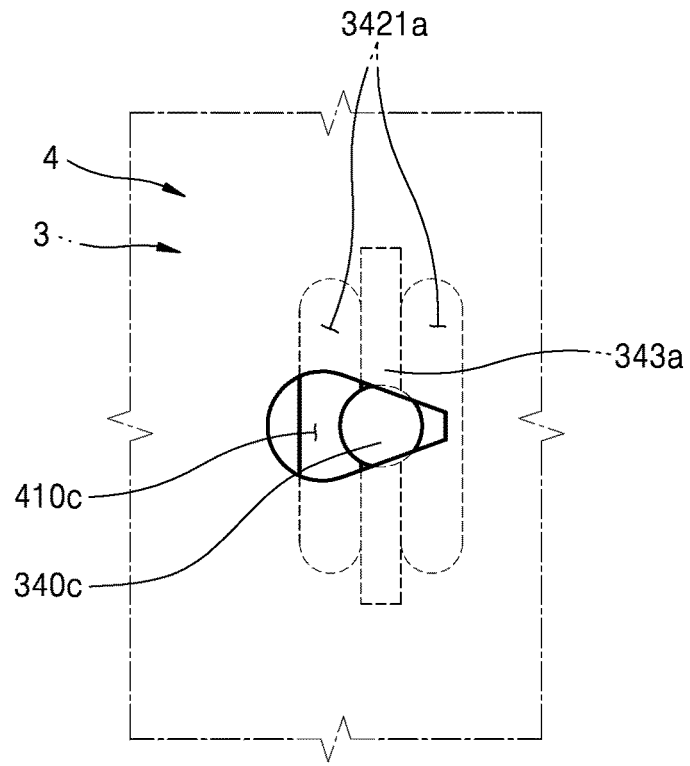
FIGS. 16A and 16B are diagrams for explaining an operation of the coupling structure of FIG. 15.
Figure 16B:
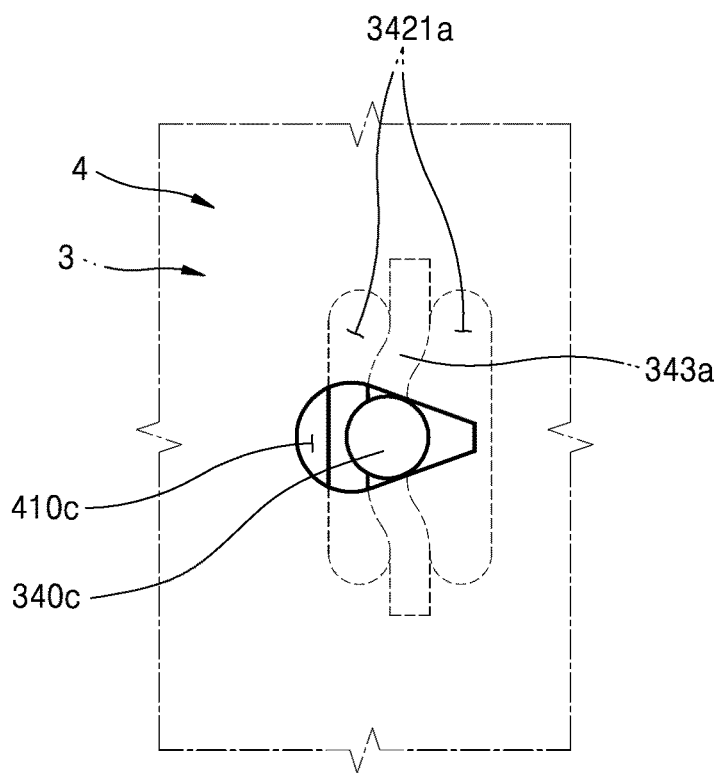

FIG. 15 is a diagram for explaining a coupling structure according to another example. FIGS. 16A and 16B are diagrams for explaining an operation of the coupling structure of FIG. 15.

Referring to FIG. 15, a coupling protrusion 340c is provided on a light guide member 33 and a coupling hole 410c is provided in a printed circuit board 4. The coupling hole 410c has a length and a width thereof decreases in a lengthwise direction. A width of the coupling hole 410c of the printed circuit board 4 may be decreased toward a center of the printed circuit board 4.

The coupling protrusion 340c may be supported on the light guide member 33 by a bridge type support structure. For example, in the light guide member 33, a third auxiliary coupling hole 3421 may be provided near a support region 343a supporting the coupling protrusion 340c.

The support region 343a may protrude from a surface of the light guide member 33. The support region 343a may function as a spacer for keeping the distance between the printed circuit board 4 and the light guide member 33 constant.

Referring to FIG. 16A, the coupling protrusion 340c may be provided at a location on the light guide member 33 such that a portion of the coupling protrusion 340c does not overlap the coupling hole 410c of the printed circuit board 4. In this case, when the light guide member 33 is pressurized to come close to the printed circuit board 4, the support region 343a may be elastically deformed and thus the coupling protrusion 340c may be inserted into the coupling hole 410c as illustrated in FIG. 16B.

Figure 17:
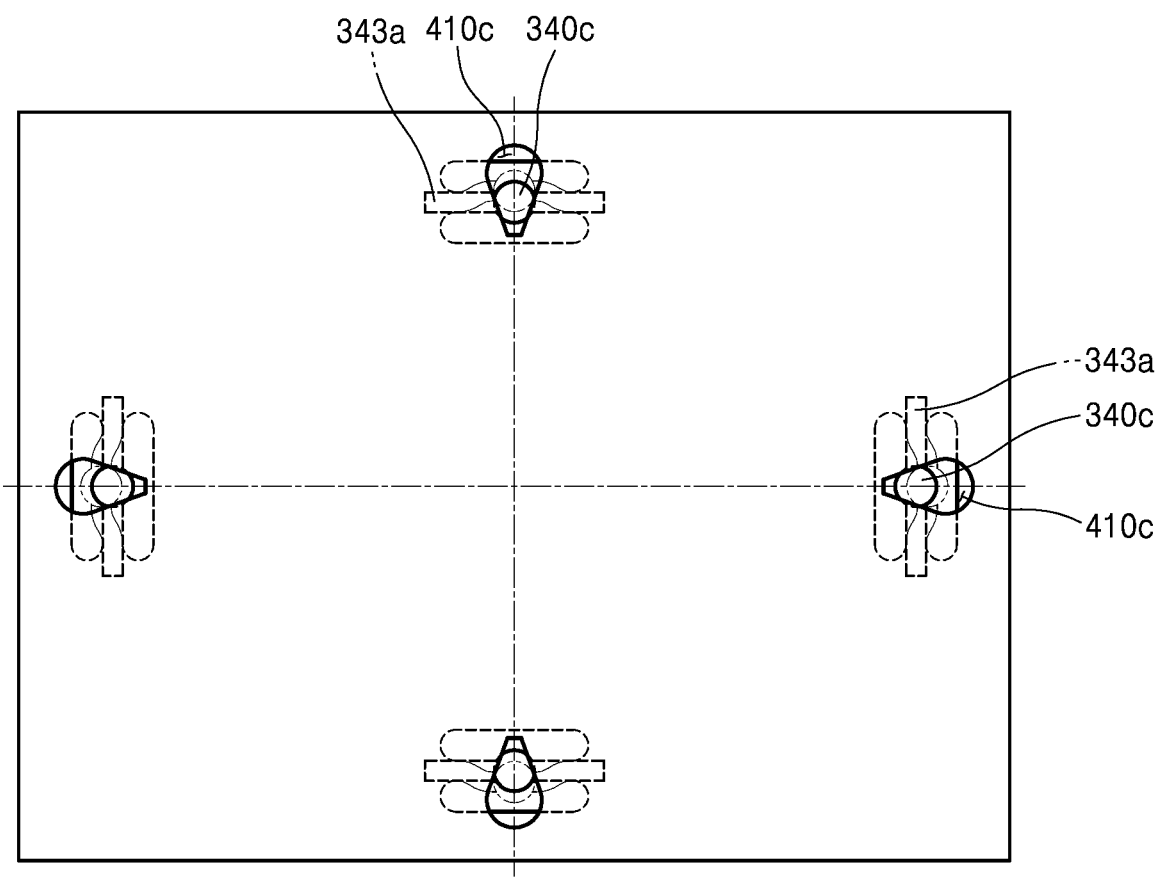
FIG. 17 is a diagram illustrating operations of a plurality of coupling protrusions and a plurality of coupling holes, the coupling protrusions and the coupling holes being illustrated in FIG. 15.

FIG. 17 is a diagram illustrating operations of a plurality of coupling protrusions 340c and a plurality of coupling holes 410c as illustrated in FIG. 15. Referring to FIG. 17, a plurality of support regions 343a supporting the plurality of coupling protrusions 340c are elastically deformed and the plurality of coupling protrusions 340c are inserted into the plurality of coupling holes 410c. As the plurality of coupling protrusions 340c and the plurality of coupling holes 410c are pressurized in opposite directions, an interference fit is formed between the light guide member 33 and the printed circuit board 4.

Referring back to FIGS. 1, 4A and 4B, the display apparatus 1 according to an example has a structure in which the light guide member 33 surrounds the edge of the display module 2. The light guide member 33 may function as a case covering the edge of the display apparatus 1. That is, the light guide member 33 may be used as a case covering the edge of the light guide member 33 without additionally providing a case on the edge of the light guide member 33.

When the light guide member 33 is used as a portion of a case as described above, at least the reflective surfaces 331 and 332 among the reflective surfaces 331, 332, 333a, and 333b provided in a path of light of the first and second light guide portions 3301 and 3302 of the light guide member 33 may be exposed to the outside. For example, the first and second reflective surfaces 331 and 332 of the first and second light guide portions 3301 and 3302 may be exposed to the outside.

Infrared rays may be designed to be incident on the first and second reflective surfaces 331 and 332 at an angle greater than a critical angle. Thus, the infrared rays may be totally reflected from the first and second reflective surfaces 331 and 332. For example, when the light guide member 33 includes polycarbonate (PC) and has a refractive index of 1.59, the critical angle of the first and second reflective surfaces 331 and 332 may be about 39 degrees. The first and second reflective surfaces 331 and 332 may be designed such that infrared rays are incident thereon at 45 angles and the incident infrared rays may be totally reflected from the first and second reflective surfaces 331 and 332.

The critical angle is determined by a refractive index of a medium. Thus, when the first and second reflective surfaces 331 and 332 of the light guide member 33 are touched by an object which is not air, e.g., a user's finger, the critical angle of the first and second reflective surfaces 331 and 332 may be changed.

Figure 18:
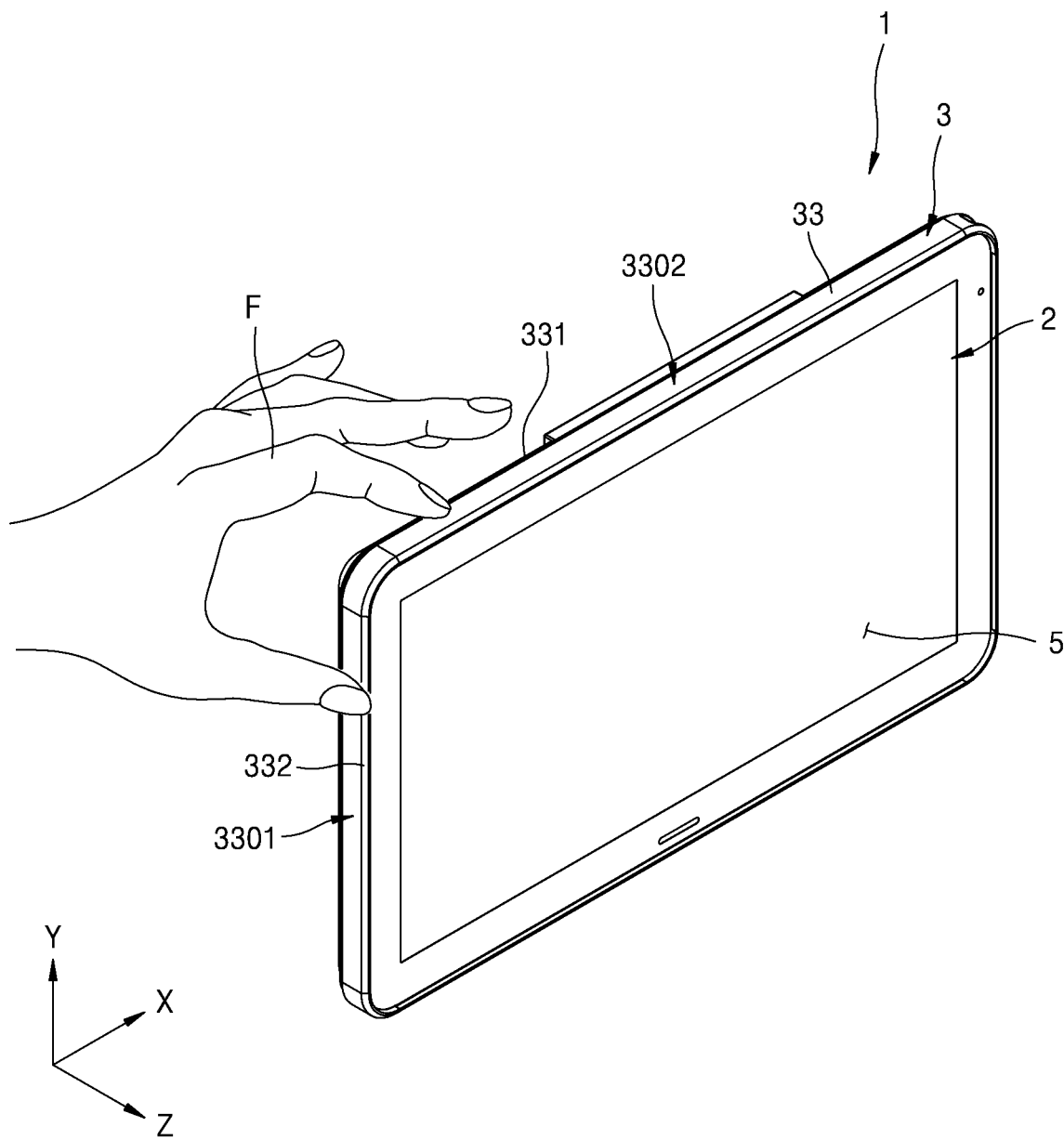
FIG. 18 is a diagram illustrating an example of a state in which a display apparatus according to an example is in use.

FIG. 18 is a diagram illustrating an example of a state in which a display apparatus 1 according to an example is in use. Referring to FIG. 18, a portion of the display apparatus 1 may be touched by a user's finger F. For example, at least one of the first reflective surface 331 and the second reflective surface 332 of the light guide member 33 may be touched by a finger. As described above, when the first and second reflective surfaces 331 and 332 of the light guide member 33 are touched by the finger F, a critical angle of the reflective surfaces 331 and 332 with respect to infrared rays may be changed and thus reflectivity of the first and second reflective surfaces 331 and 332 may be influenced by the change in the critical angle. In particular, when the finger F is stained with sweat or water, the reflectivity of the first and second reflective surfaces 331 and 332 may be greatly influenced by the change in the critical angle.

Figure 19:
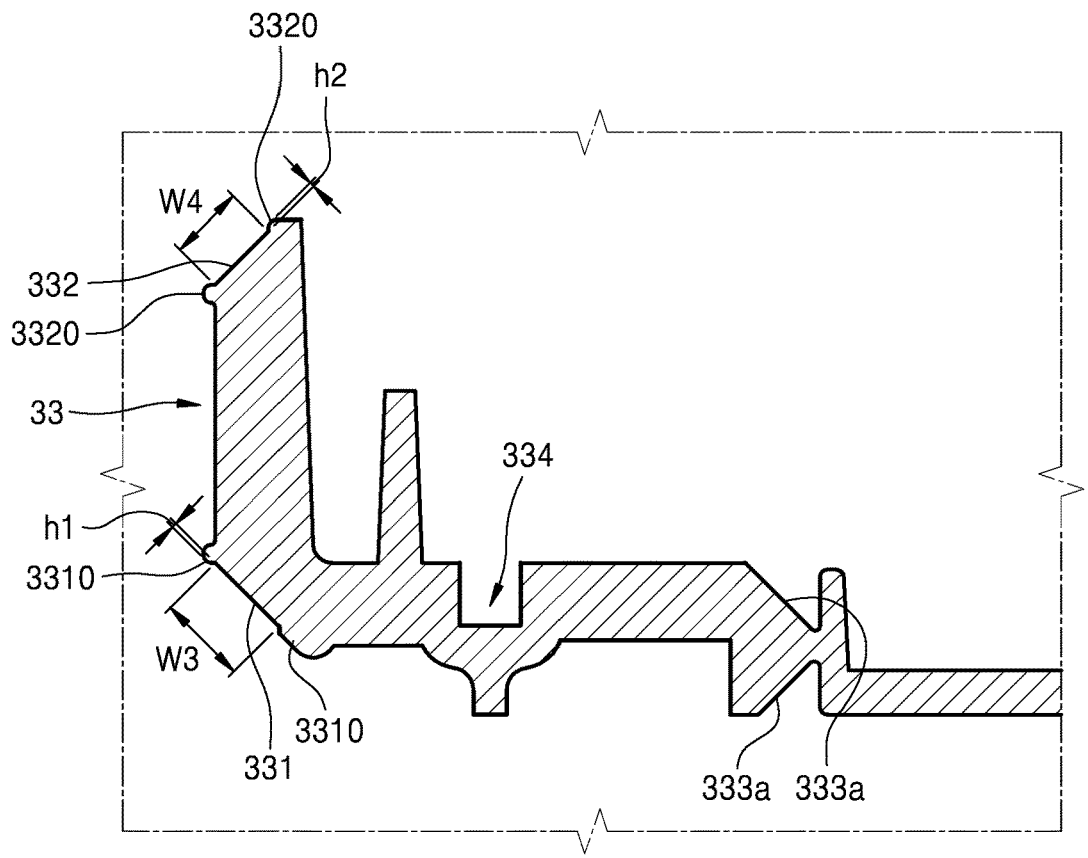
FIG. 19 is a cross-sectional view of a portion of a light guide member according to another example.
Figure 20:
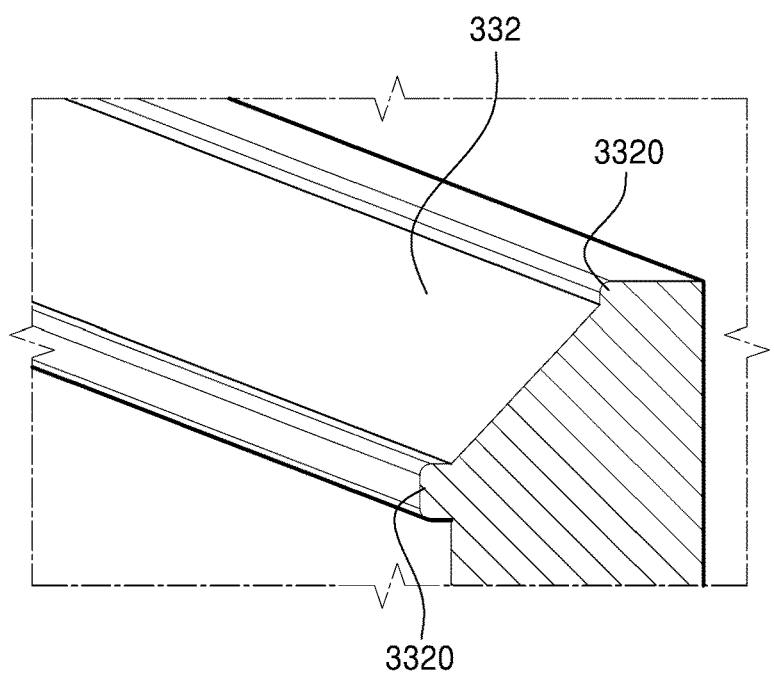
FIG. 20 is a perspective view of a portion of a light guide member according to another example.
Figure 21A:
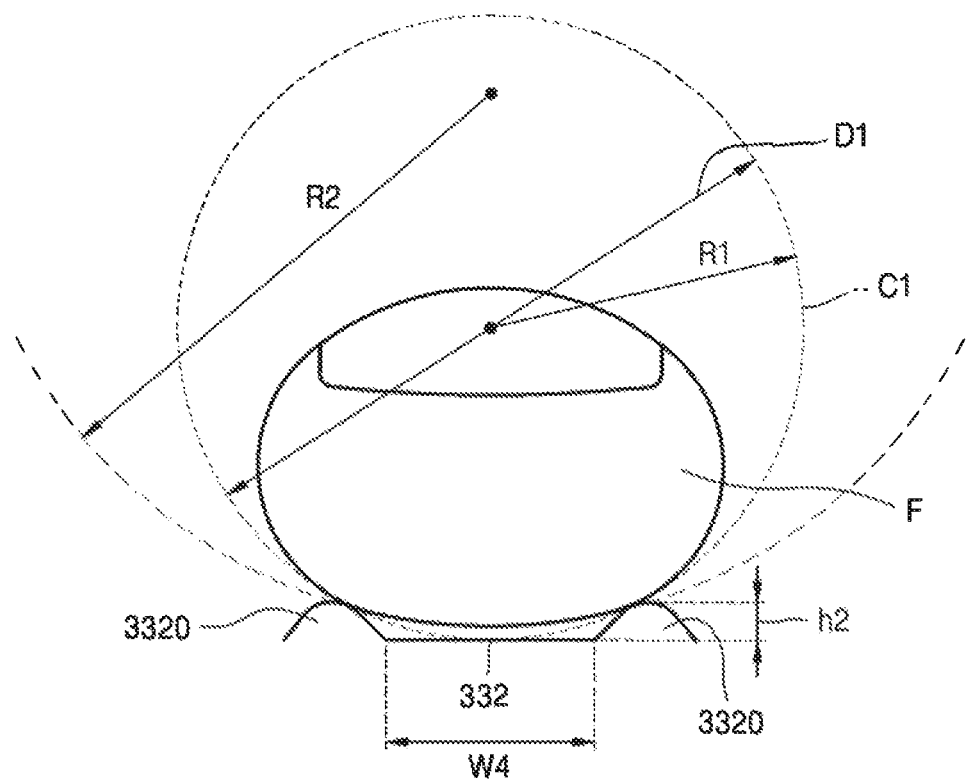
FIGS. 21A and 21B are diagrams for explaining anti-contact protrusions.
Figure 21B:
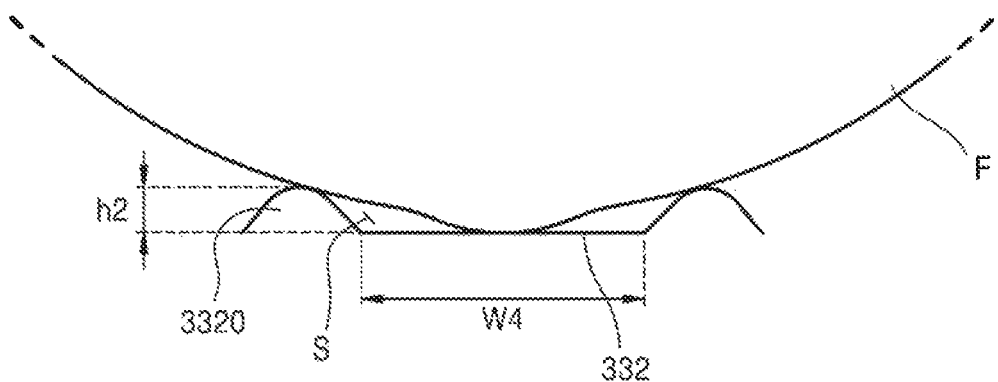

FIG. 19 is a cross-sectional view of a portion of a light guide member 33 according to another example. FIG. 20 is a perspective view of a portion of the light guide member 33 according to another example. FIGS. 21A and 21B are diagrams for explaining first and second anti-contact protrusions 3310 and 3320.

Referring to FIGS. 19 and 20, a pair of first anti-contact protrusions 3310 protruding toward the outside may be provided at a surface adjacent to a first reflective surface 331. A pair of second anti-contact protrusions 3320 protruding toward the outside may be provided at a surface adjacent to a second reflective surface 332.

A width W3 of the first reflective surfaces 331, a width W4 of the second reflective surface 332, a height h1 of the first anti-contact protrusions 3310, and a height h2 of the second anti-contact protrusion 3320 may be measurements designed such that the first and second reflective surfaces 331 and 332 are prevented from being touched by a user's finger. For example, the widths W3 and W4 of the first and second reflective surfaces 331 and 332 may be 3 mm or less. For example, the width W3 of the first reflective surface 331 may be 2.5 mm, and the width W4 of the second reflective surface 332 may be 2 mm. The heights h1 and h2 of the first and second anti-contact protrusions 3310 and 3320 may be in a range of 0.1 mm to 0.5 mm.

Referring to FIG. 21A, the pair of second anti-contact protrusions 3320 are formed adjacent to the second reflective surface 332 of the light guide member 33 and spaced apart from each other. When the pair of second anti-contact protrusions 3320 have the height h2 of 0.3 mm and planes inclined at 45 degrees and the second reflective surface 332 therebetween has the width W4 of 2 mm, an imaginary circle C1 in which the second reflective surface 332 may be touched has a diameter D1 of about 6 mm and a radius R1 of about 3 mm.

Generally, since a radius of curvature R2 of a finger F is 5 mm or more, touching of the second reflective surface 332 of the display apparatus 1 by a user's finger F may be prevented or minimized when the height h2 of the second anti-contact protrusion 3320 is designed to be in a range of 0.1 mm to 0.5 mm and the width W4 of the second reflective surface 332 is designed to be 3 mm or less as described above.

Referring to FIG. 21B, since a user's finger F is not a rigid body, a degree of surface curvature of the finger F may be changed by pressure applied thereto. Accordingly, the second reflective surface 332 may be touched by a portion of the surface of the finger F.

Even if the second reflective surface 332 may be touched by a portion of the surface of the finger F, a space S is formed between the finger F, the second reflective surface 332, and the second anti-contact protrusion 3320 due to the second anti-contact protrusions 3320 adjacent to the second reflective surface 332, and thus the entire second reflective surface 332 is prevented from being touched by the finger F. For example, a width of a portion of the second reflective surface 332 touched by the finger F may be less than 40% of a total width of the second reflective surface 332 due to the second anti-contact protrusions 3320. Since 60% or more of the total width of the second reflective surface 332 may be exposed to air, the light guide member 33 may operate normally.

Accordingly, even if the light guide member 33 is touched by a user while the light guide member 33 is used as a portion of a case, erroneous touch recognition may be prevented from occurring, since the first and second anti-contact protrusions 3310 and 3320 are provided adjacent to the first and second reflective surfaces 331 and 332.

Although FIGS. 21A and 21B have been described above with respect to the second reflective surface 332 and the second anti-contact protrusion 3320, the above description may also apply to the first reflective surface 331 and the first anti-contact protrusion 3310. For example, when the width W3 of the first reflective surface 331 is designed to be 3 mm or less and the height h1 of the first anti-contact protrusion 3310 is designed to be in a range of 0.1 mm to 0.5 mm, touching of the first reflective surface 332 of the display apparatus 1 by the user's finger F may be prevented or minimized.

Figure 22:
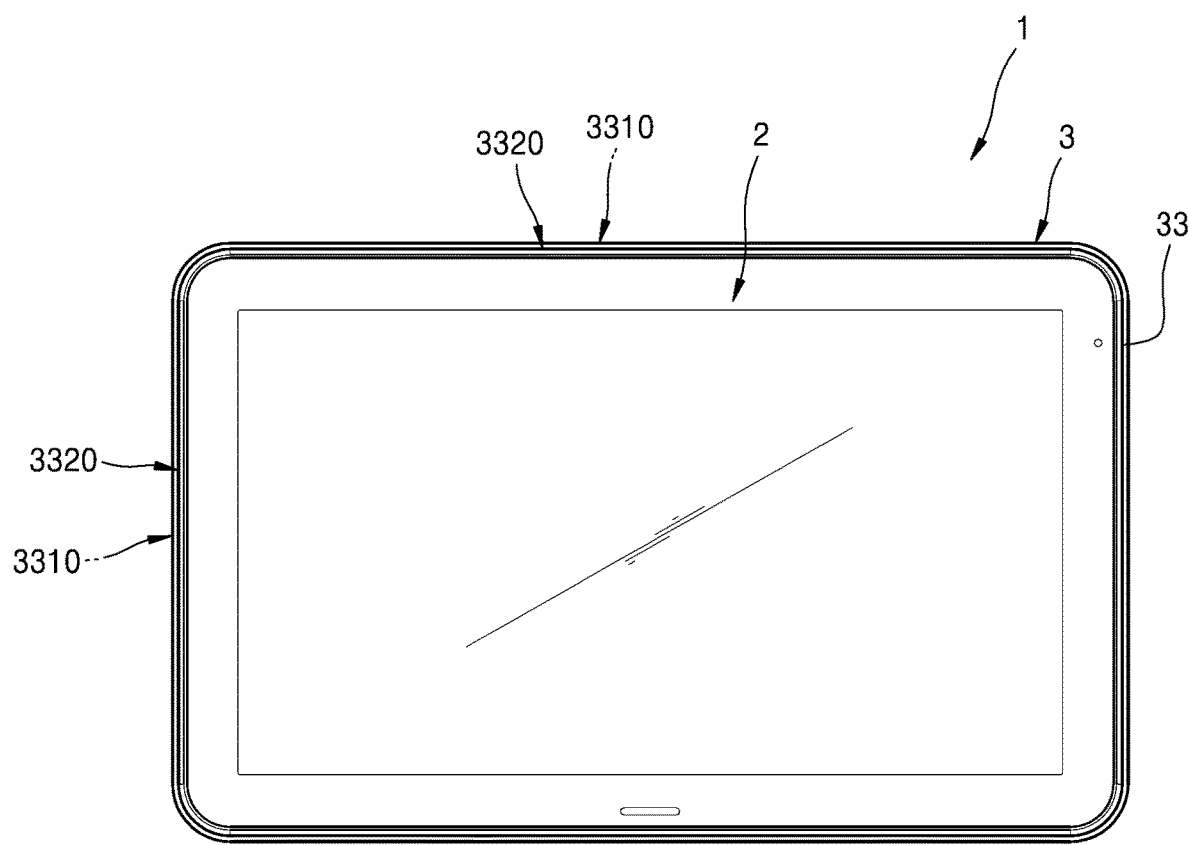
FIGS. 22 to 24 are front views illustrating examples of display apparatuses in which anti-contact protrusions are provided on a light guide member.
Figure 23:
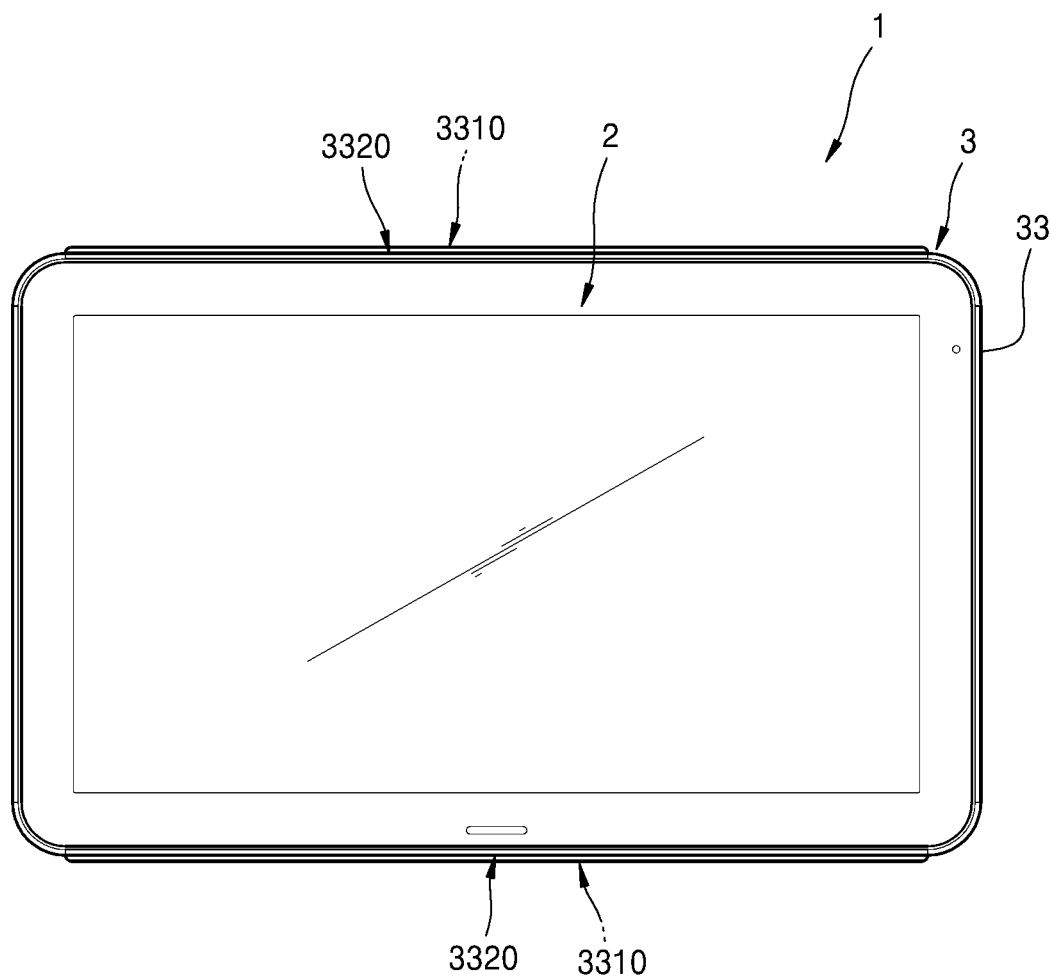
Figure 24:
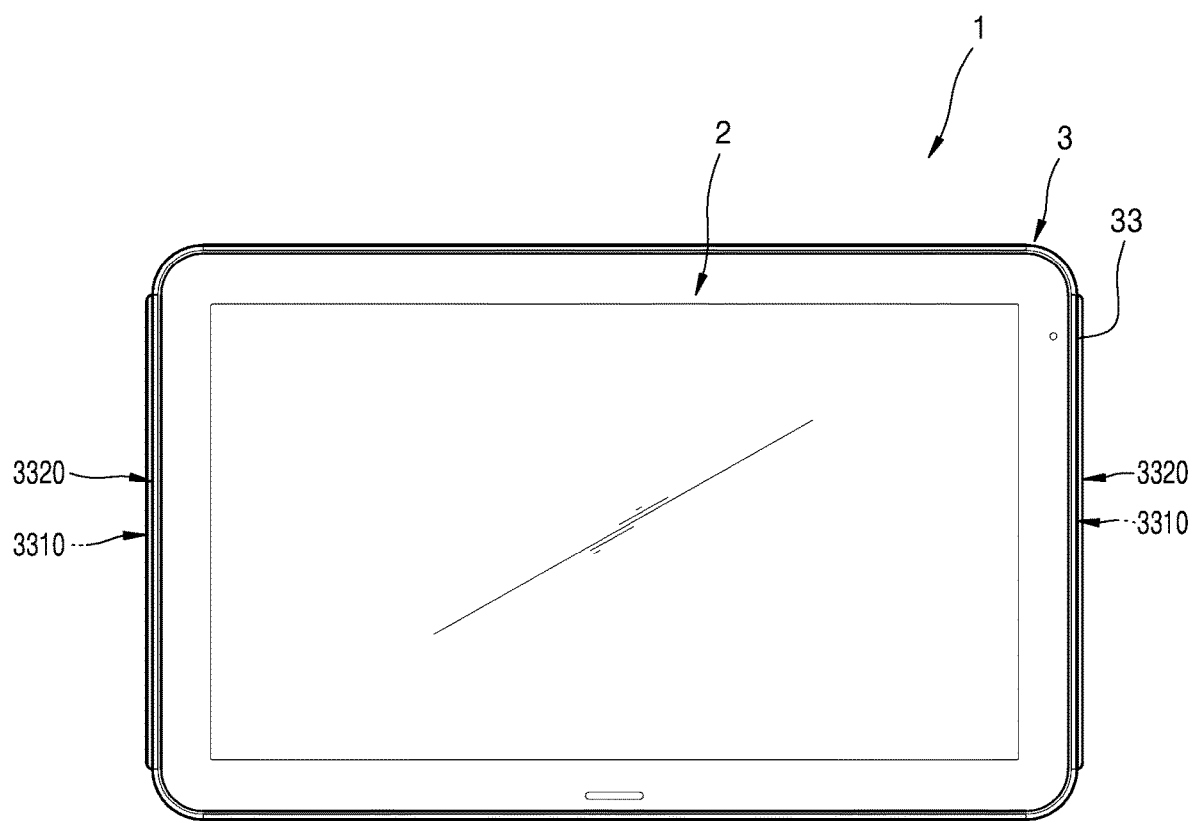

FIGS. 22 to 24 are front views illustrating examples of a display apparatus 1 in which first and second anti-contact protrusions 3310 and 3320 are provided on a light guide member 33. Referring to FIG. 22, the first and second anti-contact protrusions 3310 and 3320 may be provided on long sides of the light guide member 33 as well as a short side thereof. However, the locations of the first and second anti-contact protrusions 3310 and 3320 are not limited thereto, and the first and second anti-contact protrusions 3310 and 3320 may be omitted from the short sides of the light guide member 33 and provided on the long sides of the light guide member 33 as illustrated in FIG. 23 or may be omitted from the long sides of the light guide member 33 and provided on the short sides of the light guide member 33 as illustrated in FIG. 24. Although not shown, the light guide member 33 may include one of the first and second anti-contact protrusions 3310 and 3320.

Figure 25:
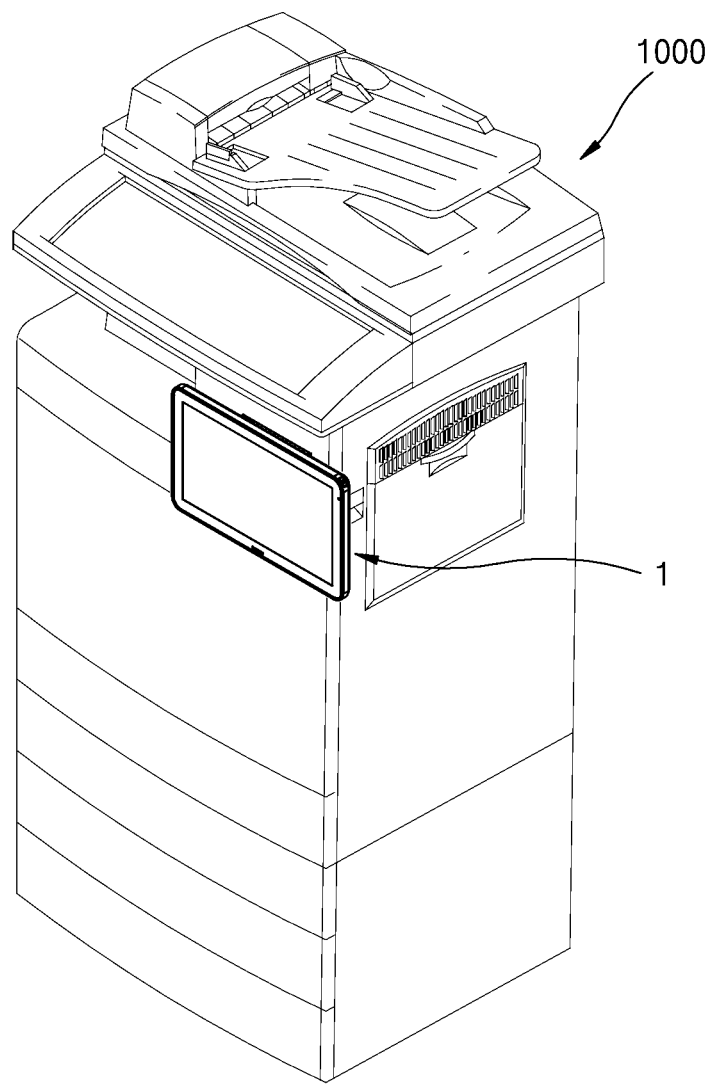
FIG. 25 is a perspective view of an image forming apparatus including a display apparatus.

FIG. 25 is a perspective view of an image forming apparatus 1000 having a display apparatus 1.

Referring to FIG. 25, the image forming apparatus 1000 may include a display apparatus 1 according to one of the above-described examples. The display apparatus 1 is substantially the same as one of the above-described examples of the display apparatus 1 and is not redundantly described again here.

The image forming apparatus 1000 may be an electrophotographic image forming apparatus. The image forming apparatus 1000 prints an image on a recording medium by forming an electrostatic latent image on a surface of a photosensitive body by emitting light modulated to correspond to image information, developing a visual toner image by supplying toner to the latent image, and transferring and fixing the toner image onto the recording medium.

While cases in which the display apparatus 1 is employed in the image forming apparatus 1000 are described above in the above examples, examples of use of the display apparatus 1 is not limited thereto. For example, the display apparatus 1 is also available as an input and output for another type of electronic device or may be used alone without any electronic device.

The above-described examples are merely examples and thus various changes may be made therein and other equivalent examples may be derived from the above-described examples. Accordingly, the scope of the disclosure is defined by the claims appended herein.

The invention claimed is:

1. A display apparatus, comprising:
a display module;
a printed circuit board located behind the display module, the printed circuit board including:
 a plurality of light emitters, mounted on the printed circuit board, to emit infrared rays, and
 a light receiver, mounted on the printed circuit board and spaced apart from the plurality of light emitters, to receive infrared rays; and
a touch screen module to provide a touch space in front of the display module, the touch screen module including:
 a light guide member, surrounding a perimeter of the display module, to guide the infrared rays emitted from the plurality of light emitters to be incident into the touch space and guide the infrared rays incident into the touch space to be received by the light receiver, and an interference fit is provided between the printed circuit board and the light guide member through elastic deformation of at least one of the printed circuit board or the light guide member,
wherein
the light guide member includes a plurality of coupling protrusions, and
the printed circuit board includes a plurality of coupling holes combined with the plurality of coupling protrusions to form the interference fit between the printed circuit board and the light guide member such that a width of the plurality of coupling holes is less than that of the plurality of coupling protrusions before the plurality of coupling holes are combined with the plurality of coupling protrusions, and is equal to that of the plurality of coupling protrusions when the plurality of coupling protrusions are combined with the plurality of coupling holes.

2. The display apparatus of claim 1, wherein the plurality of coupling holes include: two first coupling holes spaced apart from each other in a first direction, and at least one second coupling hole provided between the two first coupling holes in the first direction and spaced apart from the two first coupling holes in a second direction perpendicular to the first direction.

3. The display apparatus of claim 1, wherein the printed circuit board is elastically deformable such that the width of the plurality of coupling holes increases when the plurality of coupling protrusions are combined with the plurality of coupling holes.

4. The display apparatus of claim 3, wherein the printed circuit board further includes at least one first auxiliary coupling hole adjacent to the plurality of coupling holes.

5. The display apparatus of claim 1, wherein the light guide member is elastically deformable such that a width of the plurality of coupling protrusions decreases when the plurality of coupling protrusions are combined with the plurality of coupling holes.

6. The display apparatus of claim 5, wherein the light guide member further includes at least one second auxiliary coupling hole adjacent to the plurality of coupling protrusions.

7. The display apparatus of claim 1, wherein the light guide member further includes: a support region, to support the plurality of coupling protrusions, elastically deformable when the plurality of coupling protrusions are combined with the plurality of coupling holes, and a support region auxiliary coupling hole adjacent to the support region.

8. The display apparatus of claim 7, further comprising:
a screw including a screw portion and a head portion, the screw portion screwable into and thereby combinable with one of the plurality of coupling protrusions, and the head portion having a diameter larger than the width of the plurality of coupling holes,
wherein
an external diameter of the plurality of coupling protrusions decreases in a height direction from the light guide member toward the printed circuit board, and,
the support region is elastically deformable when the screw is screwed into the one of the plurality of coupling protrusions to combine the one of the plurality of coupling protrusions with one of the plurality of coupling holes.

9. The display apparatus of claim 7, wherein the width of the plurality of coupling holes decreases in a lengthwise direction.

10. The display apparatus of claim 1, wherein the light guide member further includes:
a reflective surface, exposed to an outside of the display apparatus, to reflect infrared rays, and
an anti-contact protrusion, protruding toward the outside, provided adjacent to the reflective surface.

11. The display apparatus of claim 10, wherein the reflective surface has a width of 3 mm or less.

12. The display apparatus of claim 10, wherein a height of the anti-contact protrusion is in a range of 0.1 mm to 0.5 mm.

13. The display apparatus of claim 1, wherein the light guide member further includes:
a diffusion region to diffuse the infrared rays emitted from the plurality of light emitters, and
a light collection region to collect infrared rays that have passed through the touch space.

14. An image forming apparatus, comprising:
a main body;
a photosensitive body to be irradiated with light to form an electrostatic latent image on the photosensitive body;
a developing device to supply toner to the electrostatic latent image to form a visible image;
a transfer device to transfer the visible image to a recording medium; and
a display apparatus, attachable to the main body, to receive a touch input to control an operation of the image forming apparatus, the display apparatus including:
a display module,
a printed circuit board located behind the display module, the printed circuit board including:
a plurality of light emitters, mounted on the printed circuit board, to emit infrared rays, and
a light receiver, mounted on the printed circuit board and spaced apart from the plurality of light emitters, to receive infrared rays, and
a touch screen module to provide a touch space in front of the display module, the touch screen module including:
a light guide member, surrounding a perimeter of the display module, to guide the infrared rays emitted from the plurality of light emitters to be incident into the touch space and guide the infrared rays incident into the touch space to be received by the light receiver, and an interference fit is provided between the printed circuit board and the light guide member through elastic deformation of at least one of the printed circuit board or the light guide member,
wherein
the light guide member includes a plurality of coupling protrusions, and
the printed circuit board includes a plurality of coupling holes combined with the plurality of coupling protrusions to form the interference fit between the printed circuit board and the light guide member such that a width of the plurality of coupling holes is less than that of the plurality of coupling protrusions before the plurality of coupling holes are combined with the plurality of coupling protrusions, and is equal to that of the plurality of coupling protrusions when the plurality of coupling protrusions are combined with the plurality of coupling holes.

\* \* \* \* \*